United States Patent [19]

Nicolaidis

[11] Patent Number: 5,469,445
[45] Date of Patent: Nov. 21, 1995

[54] TRANSPARENT TESTING OF INTEGRATED CIRCUITS

[75] Inventor: Michael Nicolaidis, Grenoble, France

[73] Assignee: Sofia Koloni Ltd., Athens, Greece

[21] Appl. No.: 140,156

[22] Filed: Nov. 4, 1993

[30] Foreign Application Priority Data

Mar. 5, 1992 [GR] Greece ................. 920100088

[51] Int. Cl.[6] .................. G06F 11/26; G11C 29/00
[52] U.S. Cl. .................. 371/22.3; 371/25.1
[58] Field of Search .................. 371/22.1, 22.3, 371/25.1, 21.2, 22.4; 324/527, 537

[56] References Cited

U.S. PATENT DOCUMENTS

| | | | |
|---|---|---|---|
| 4,687,988 | 8/1987 | Eichelberger et al. | 371/25.1 |
| 4,698,588 | 10/1987 | Hwang et al. | 371/25.1 |
| 4,831,623 | 5/1989 | Terzian | 371/22.1 |
| 4,870,345 | 9/1989 | Tomioka et al. | 371/22.3 |
| 4,929,889 | 5/1990 | Seiler et al. | 371/22.3 |
| 4,995,039 | 2/1991 | Sakashita et al. | 371/22.3 |
| 5,032,783 | 7/1991 | Hwang et al. | 371/25.1 |
| 5,047,710 | 9/1991 | Mahoney | 371/22.3 |
| 5,155,432 | 10/1992 | Mahoney | 371/22.3 |

FOREIGN PATENT DOCUMENTS 0240199  10/1987  European Pat. Off. .

OTHER PUBLICATIONS

"Circular Self–Test Path: A Low–Cost BIST Technique", A. Krasniewski et al, Proceedings of the 24th ACM/IEEE Design Automation Conference, 1987, pp. 407–415.
"Real Time Data Non–Destructive RAM Self Testing", D. B. Schowengerdt et al, Proceedings of the IECI 1981, Nov. 9–12, 1981, pp. 144–148.

*Primary Examiner*—Paul P. Gordon
*Attorney, Agent, or Firm*—Lowe, Price, LeBlanc & Becker

[57] ABSTRACT

To carry out a transparent test of integrated circuits, all of the state registers and input/output registers that determine the applications' execution context are included into circular scan paths having the output of the last stage connected to the input of the first stage. Before the test, the contents of the registers are shifted via the scan path into a RAM. After the test, the saved contents of the registers are reloaded from the RAM to the registers via the scan path.

11 Claims, 5 Drawing Sheets

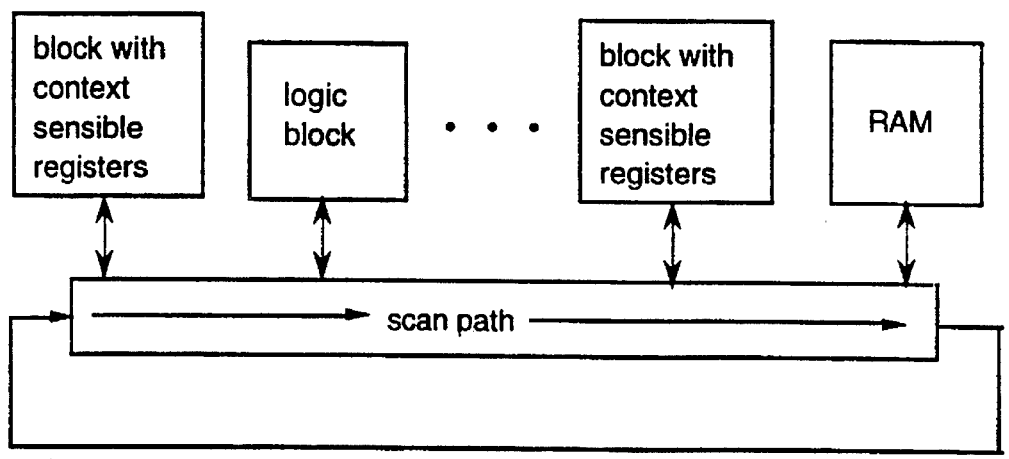
FIG. 1
| a | a | a | a | a | a | ............ | a | a |
| b | b | b | b | b | b | ............ | b | b |
FIG. 2a
| a | b | a | b | a | b | ............ | a | b |
| c | d | c | d | c | d | ............ | c | d |
FIG. 2b
| a | b | c | d | a | b | c | d | a | b | ......... | a | b | c | d |
| e | f | g | h | e | f | g | h | e | f | ......... | e | f | g | h |
FIG. 2c
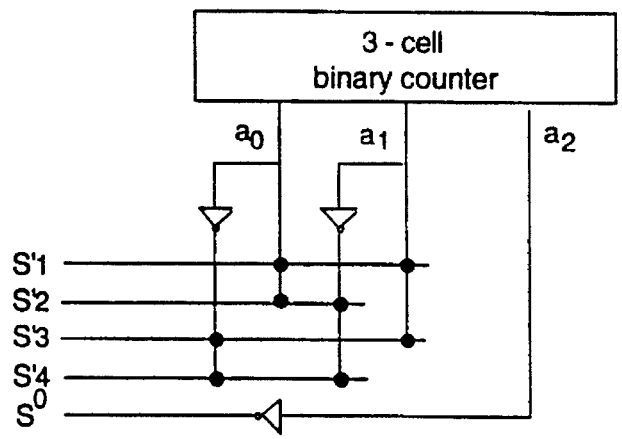
FIG. 3

TRANSPARENT TESTING OF INTEGRATED CIRCUITS

The invention concerns a technique which allows to test the integrated circuits without losing the application execution context.

Recently scan path and BIST techniques (see H. FUJIWARA "Logic Testing and Design for Testability" The MIT Press, 1985, Cambridge, Mass., London) are gaining ground in the testing of integrating circuits (ICs), and many ICs manufacturers include such test facilities in their products. Scan path and BIST facilities implemented for manufacturing testing of ICs also allows to simplify significantly the testing of ICs in the board and in the system levels. Several applications require to test periodically the ICs of the system (off-line testing). Existing scan path and BIST techniques are not adequate for such purposes, since they alter the internal state of the integrated circuit. This work is aimed to cope with this problem. The proposed techniques consider two kinds of blocks: combinational and sequential blocks on the one hand (they will called logic blocks), and various RAMs and register files on the other hand. For the first kind of blocks we use a save, test and restore technique based on scan path design. For the second kind of blocks a save, test and restore technique will require the RAM duplication, resulting on a high area overhead. To cope with this problem, we take advantage from the regularity of the RAMs and of their test algorithms, and we propose a transparent test technique, that is a technique which allows to test the RAMs without destroying their initial contents.

TRANSPARENT TESTING OF LOGIC BLOCKS

The applications' execution context of an ICs depends from the contents of the state registers of some sequential blocks and from the contents of the input/output registers of some sequential or combinational blocks. These registers will be called context sensible registers. The off-line test session must not involve the loss of the contents of these registers.

Scan path techniques are very popular for testing the combinational and sequential blocks of ICs. During the test session this technique transforms into a shift register the state and/or the input/output registers of the logic blocks. The resulting shift registers are interconnected to form a scan chain which allows to bring the test vectors to the inputs of each block and to bring out the output responses of the blocks.

For the purposes of the off-line testing, the scan path facilities can be used in order to avoid the loss of the contents of the context sensible registers. To do that all the context sensible registers are included to some scan path(s). The save, test and restore phases are as following:

Before starting the test session the contents of context sensible registers are shifted until the data inputs of a RAM and are written in this RAM. The memory used for this purpose can be an external memory, or an existing internal memory of the integrated circuit, or even an auxiliary memory implemented in the IC for the purposes of this operation. According to the number, and the size of the context sensible registers and the size of the RAM words, the contents of these registers will be saved in several RAM words. If the size of a register is greater than the size of the RAM word, its contents will be saved to several RAM words. If two registers are in successive positions in the scan path and if they have a total number of bits lower than the number of bits of the RAM words, they can be stored in the same RAM word. More generally, if several context sensible registers are in successive positions in the scan path and they have a total number of n bits, and if each RAM word has k bits, then, the contents of these registers will be saved into $\lceil n/k \rceil$ RAM words.

When all the contents of the context sensible registers have been saved we perform the off-line test session.

After the end of this session the contents of the context sensible registers are restored. To do that the RAM words containing some of these data are read and loaded in the scan path as following:

firstly, the word loaded at first in the RAM (during the save phase) is read and loaded in the scan path, then, we perform several shift operations and we load in the scan path the word loaded at second in the RAM and so on . . . The number of shifts depends from the size of the RAM words, from the size of the context sensible registers and from their relative position in the scan path chain. These operations allow to load adequately the data in the scan path.

Then we perform several shift operation until to place the data in the respective registers. To allow this last operation the scan path must be circular (i.e. the output of the last stage is connected to the input of the first stage) as illustrated in FIG. 1.

TRANSPARENT TESTING OF RAMS

In the following we consider the case of various RAMs and register files (which will be named RAMs), and we present a transparent test technique, that is a technique which allows to test the RAMs without destroying their initial contents. This technique can be implemented by using BIST or scan path techniques.

RAM Fault Models

Before describing the RAM transparent test technique we present the existing RAM fault models. Stuck-at faults, transition faults, coupling faults and pattern sensitive faults are widely recognized classes of predominant faults occurring in Random Access Memories (e.g. "THATTE S. M, ABRAHAM J. A. "Testing of semiconductor random access memories"—IEEE Transactions on Computers vol. C-26 June 1978", "SUK D. S., REDDY S. M. "Test procedures for a class of pattern sensitive faults in semiconductor random access memories" IEEE Transactions on Computers vol. C-34, n° 2, pp 110–116, February 1985", "Marinescu M. "Simple and efficient algorithms for functional RAM testing", IEEE International Test Conference, November 1982", "HAYES J. P. "Testing memories for single-cell pattern sensitive fault"—IEEE Transactions on Computers vol. C-29 n° 3 March 1980" and "SUK D. S., REDDY S. M.—"A march test for functional faults in semiconductor random access memories"—IEEE Transactions on Computers vol. C-30 n° 12 December 1981"). They can be classified as in "VAN DE GOOR A. J., VERRUIJT C. A.—"An overview of deterministic functional RAM chip testing"— ACM Computing Surveys, vol. 22, n° 1, March 1990":

1) Stuck-at faults: A permanent stuck-at 0 or stuck-at 1 fault that may occur in any memory cell.

2) Transition faults: A memory cell in state s ($s \in \{0,1\}$) fails to undergo an s to $\bar{s}$ transition when $\bar{s}$ is to be written in the cell.

3) Coupling faults: A write operation that affects a 0→1 or a 1→0 state transition (say transition t) in a cell cj, changes the state of another memory cell ci (i≠j) from s to $\bar{s}$, independently of the contents of the other cells. This fault will be represented as $T(i_s, i_t)$—(Marinescu M. "Simple and efficient algorithms for functional RAM testing", IEEE International Test Conference, November 1982) classifies the coupling faults as following:

idempotent (or noninverting) coupling faults, that is: a positive (or negative) transition in a cell cj forces another cell ci to a certain value, 0 or 1.

inverting coupling faults, that is: a positive (or negative) transition in a cell cj inverts the contents of a cell ci.

Active and passive pattern sensitive faults have also been defined (see (SUK D. S., REDDY S. M. "Test procedures for a class of pattern sensitive faults in semiconductor random access memories" IEEE Transactions on Computers vol. C-34, n° 2, pp 110–116, February 1985):

4) Passive Pattern Sensitive Faults (PNPSF): if the states of some cells c1, c2, . . . , ck have some particular values $s_1, s_2, \ldots, sk$, when the state of cell ci is s, we cannot write $\bar{s}$ in the cell ci. This fault will be represented as $PN(i_s, 1_{s1}, 2_{s2}, \ldots, k_sk)$.

5) Active Pattern Sensitive Faults (ANPSF): when the states of some cells c1, c2, . . . , ck (often assumed to be in the neighborhood of the base cell ci) have some particular values $s_1, s_2, \ldots, s_k$, the transition of the cell cj from t to $\bar{t}$ changes the state of the cell ci from s to $\bar{s}$. This fault will be represented as $AN(i_s, j_t, 1_{s1}, 2_{s2}, \ldots k_{sk})$. Note that coupling faults is a particular case of ANPSF for which the deleted neighborhood is empty.

Some authors have also studied variations of these fault models, for example static and dynamic pattern sensitive faults (see SALUJA K.K., KINOSHITA K.—"Test pattern generation for API faults in RAM. IEEE Transactions on Computers C-34,3 March 1985).

6) Finally Decoder and READ/WRITE Logic faults can be modeled as memory cell array faults (see NAIR. R THATTE S. M, ABRAHAM J. A. "Efficient algorithms for testing semiconductor Random-Access Memories", IEEE Transactions on Computers, Vol C-27, pp 572–576, June 1978, and also THATTE S. M, ABRAHAM J. A. "Testing of semiconductor random access memories" Proc. 7th International Symposium on Fault tolerant Computing) and need not be considered explicitly.

Preliminaries on Transparent BIST for RAMs

In order to avoid the loss of the applications' execution context of an integrated circuit when we test some RAM block, we will use a transparent BIST scheme, that is a BIST scheme which allows to test the RAM without destroying its initial contents.

The pioneering work on this field has been presented by B. Koeneman in the 1986 DFT workshop, in Vail Colorado. This is the only known work on this area. This technique is based on the linearity of the signature analyzers. The test algorithm is composed from several elementary test segments. Let A represent an ordered data string, and let s(A) be its signature. Let TP represent a test pattern. Each test segment is as following:

| | |
|---|---|
| Start: | Reset Signature |
| Loop1: | Read (CONTENTS), |
| | take signature s(CONTENTS), and |
| | write (CONTENTS.XOR. TP) = NEW CONTENTS. |
| Next: | Save s(CONTENTS), and reset signature. |
| Loop 2: | Read (NEW CONTENTS), |
| | take signature s(NEW CONTENTS), |
| | write (NEW CONTENTS.XOR.TP). |
| End: | Result: s(NEW CONTENTS).XOR.s(CONTENTS). |

In the above process, the operations described in the loops 1 and 2 are applied to all the memory cells. At the end of the elementary segment the RAM contents are restored since the final contents are NEW CONTENTS.XOR.TP=CONTENTS.XOR.TP.XOR.TP=CONTENTS. Thus the segment is transparent.

When several segments are concatenated the restoring operation (i.e. the write operation in Loop 2) can be avoided. Only one restoring operation per cell will be used (if any) at the end of the whole test algorithm.

Due to the linearity of the MISRs (multiple input signature resisters) we have s(NEW CONTENTS)= s(CONTENTS.XOR.TP)=s(CONTENTS).XOR.s(TP) CONTENTS).XOR.s(CONTENTS)=s(TP) and thus it is predictable.

The above technique has the following drawbacks:

a) A first drawback is that this technique works only if the output response verification is performed by a linear compactor.

b) The second drawback of the technique is that for some faults the read data may contain the same error string E during both the Loop1 and the Loop2. Thus the resulting signatures will be s(CONTENTS.XOR.E) and s(NEW CONTENTS.XOR.E) and the final signature will be s(CONTENTS.XOR.E.XOR. CONTENTS.XOR.TP.XOR.E)=s(TP), which is equal to the correct signature. Thus although the applied test pattern produces an erroneous response, the error is masked. This is due on the fact that we XOR two signatures which are both taken over the data generated by the same faulty RAM. The occurrence of the same erroneous string in both Loop1 and Loop2 can be illustrated by the following example. Let a RAM with 3 cells C1, C2 and C3 and let the initial contents of these cells be 1,0 and 0 respectively. Let apply the Koeneman's technique for a test which applies the pattern TP=1,1,1 over these cells. The read and write operations during the Loop1 and Loop2 are:

| | Loop1 | Loop2 |
|---|---|---|
| C1 | R(1) W(0) | R(0) W(1) |
| C2 | R(0) W(1) | R(1) W(0) |
| C3 | R(0) W(1) | R(1) W(0). |

The string read during the Loop1 is 1,0,0 and we have s(CONTENTS)=s(1,0,0) and the string read during Loop2 is 0,1,1 and we have s(NEW CONTENTS)=s(0,1,1). Thus s(CONTENTS).XOR.s(NEW CONTENTS)=s(1,0,0).XOR.s(0,1,1 )=s(1.XOR.0,0.XOR.1,0.XOR.1)=s(1,1,1)= s(TP).

Let now consider that the memory contains a coupling fault such that the transition 1→0 of the cell C1 modifies the state of the cell C2 from 0 to 1. Due to this fault the write operation on the cell C1 during the Loop1 will change the state of the cell C2 to 1. Thus in Loop1 we will read 1 from the cell C2 and we will write 1.XOR.1=0 to this cell. In Loop2 we will read 0 from cell C2 and we will write 0.XOR.1=1. All the other operations are as in the fault free RAM. The two loops are:

|    | Loop1      | Loop2      |
|----|------------|------------|
| C1 | R(1) W(0)  | R(0) W(1)  |
| C2 | R(1) W(0)  | R(0) W(1)  |
| C3 | R(0) W(1)  | R(1) W(0). |

The signature during the Loop1 will be $s(1,1,0)$ and the signature during the Loop2 will be $s(0,0,1)$. Then we have $s(1,1,0).XOR.s(0,0,1)=s(1.XOR.0,1.XOR.0,0.XOR.1)= s(1,1,1)=s(TP)$, and the fault will not be detected. A similar situation can occur by considering some pattern sensitive faults.

In order to cope with this problem our technique predicts the signature by using a sequence which performs only read operations and then we apply our transparent test pattern. As we show later this technique copes with the drawback of point b (see lemma 3) and also with the one of point a.

c) The third drawback is that the proposed transparent test patterns are composed by elementary loops which perform one read and one write operation in each cell. However the more of the existing RAM test patterns include loops with more complex structure (see for instance table I).

Our technique is also based on the Koeneman's idea of using the RAM's contents in order to test it. But instead of using a predetermined type of loops, it starts from any existing test algorithm and transforms it to a transparent one. Thus we cope with this drawback.

d) The last drawback of the Koeneman's technique concerns the fault coverage. Since the transparent BIST requires to use new test algorithms, the fault coverage is not guaranteed. The Koeneman's work does not give a technique allowing to check if the fault coverage is decreased. In the present work we give a criterion allowing to check very easily if our transparent BIST preserves the fault coverage of the initial algorithm (see theorem 1), and we show that for the more of the known RAM fault models there is not decreasing of the fault coverage.

BRIEF DESCRIPTION OF DRAWINGS

FIG. 1 is a block diagram illustrating a circular scan path for saving and restoring the contents of the context sensible registers.

FIG. 2a is a block diagram illustrating the structure of words in RAMs without column multiplexing.

FIG. 2b is a block diagram illustrating the structure of words in RAMs with 1-out-of-2 column multiplexing.

FIG. 2c is a block diagram illustrating the structure of words in RAMs with 1-out-of-4 column multiplexing.

FIG. 3 is a block diagram illustrating the sequence control block for transparent BIST.

Figure 4A:
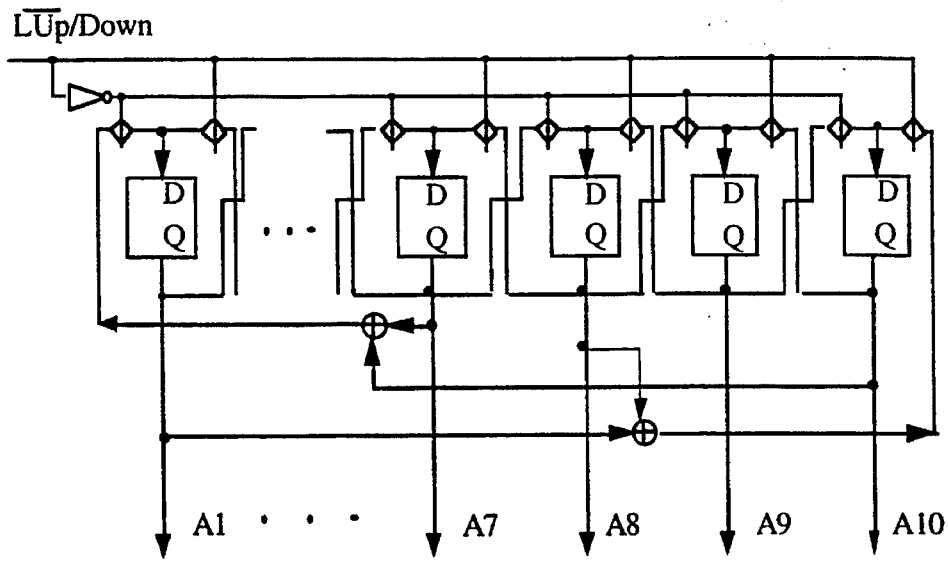
FIG. 4a is a block diagram illustrating an external XOR Up/Down LFSR.

General Guidelines for Transforming any RAM Test Algorithm to a Transparent One

The following transformations are exemplified for bit-oriented RAMs but they are also valid for word-oriented RAMs (in that case we apply the transformations to each bit of the word). Also these transformations are valid for single port and multiport RAMs. In the case of multiport RAMs the transformations are applied to the test data applied to each RAM port.

A RAM test algorithm is composed by several sequences (loops). For each addressed cell inside a sequence, one performs several read and write operations. In generally a test algorithm starts by initializing the RAM. This can be done by an initialization sequence composed by several write operations. Alternatively it can be done by severatal write operations incorporated in the first sequence of the algorithm. That is, in this sequence, each string of operations affecting a cell starts by an initialization operation (i.e. a write one). In the sequences of the most of the known deterministic RAM test patterns the first operation to each cell is a read operation (excepting during the sequence which includes the initialization operations), but let us suppose that in some algorithms the first operation performed in some addressed cell is a write one. Let ALin be the initial algorithm. Then we use the first transformation step.

Step 0: If the first operation of a string of consecutive operations performed on a memory cell i is a write one then add a read operation at the begining of the string.

Example: let for instance the algorithm ALin be the following:

|    | Init. | S1              | S2                |
|----|-------|-----------------|-------------------|
| C1 | W(0)  | W(1) R(1) W(0)  | R(0) W(1) W(0) W(1) |
| C2 | W(1)  | R(1) W(0) W(1) W(0) | R(0) W(1) — —  |
| C3 | W(0)  | W(1) R(1) W(0)  | R(0) W(1) W(0) W(1) |

Then the step 0 gives the following algorithm (a1, a2, and a3 are the values resulting by the first read operations of the memory cells):

|    | Init.'    | S1'                 | S2'                 |
|----|-----------|---------------------|---------------------|
| C1 | R(a1) W(0)| R(0) W(1) R(1) W(0) | R(0) W(1) W(0) W(1) |
| C2 | R(a2) W(1)| R(1) W(0) W(1) W(0) | R(0) W(1) — —       |
| C3 | R(a3) W(0)| R(0) W(1) R(1) W(0) | R(0) W(1) W(0) W(1) |

In generally the RAM testing algorithms include an initialization sequence (or some initialization operations incorporated in the first sequence of the algorithm). For the more of these algorithms this sequence (resp. these operations) is not useful for sensibilising the faults, but it is used for setting the memory to a known state. Let AL0 be the algorithm obtained from the step 0.

Step 1: If the algorithm ALin includes an initialization sequence (resp. some initialization operations) and if this sequence (resp. these operations) is useless for sensibilising the faults then delete this sequence (resp. these operations) from the algorithm AL0.

This step is not necessary but it reduces the test length without reducing the fault coverage. If the initialization sequence is useless for sensibilising the faults, then by applying the step 1, we obtain the following algorithm:

|    | S1'                | S2'                |
|----|--------------------|--------------------|
| C1 | R(a1) W(1) R(1) W(0) | R(0) W(1) W(0) W(1) |
| C2 | R(a2) W(0) W(1) W(0) | R(0) W(1) — —       |
| C3 | R(a3) W(1) R(1) W(0) | R(0) W(1) W(0) W(1) |

Let AL1 be the algorithm obtained from the step 1. The step 2 is applied on the algorithm AL1, as following: The algorithm AL1 performs a read operation as the first operation to each addressed cell. The read data will be stored to a register and will be used as test data until the next read operation.

Step 2:

a- Let the initialization sequence (resp. the initialization operations) be useful, then, we have to transform the algorithm AL0 as following: Let ai be the value resulting by the first read operation of a cell i in the algorithm AL0. Consider the write operations on the cell i. If the value of a write operation is 0, then, use ai as data for the write operation, otherwise use $\overline{a_i}$ as data for this operation. Alternatively we can perform this step by replacing the write values 0 by $\overline{a_i}$ and the write values 1 by ai.

b- Let the initialization sequence (resp. the initialization operations) be useless, then we have to transform the algorithm AL1 as following:

Let S1' be the first sequence of the algorithm AL1 and ai be the data of the first read operation of cell i in this sequence. Let ri be the data of the first read operation of cell i in the sequence S1' of the algorithm AL0. Let wi be the data of any write operation of the cell i in the algorithm AL1. If ri= wi then use ai as data for this write operation, otherwise use $\overline{a_i}$ as data for this operation.

In both a- and b- cases the data of each read operation of a cell (excepting the first read one) is equal to the data of the last write operation of the cell preceding the read one.

In the case b- the transformation is such that if in the initial algorithm the first write operation of a cell i involves a state transition of i, this happens also in the sequence S1'. This is not required for the sequence Init' of the case a- because the first write operations of the sequence Init of the initial algorithm initialize the RAM and thus they involve state transitions in a random way.

The step 2 determines the values of all the read and write operations of the algorithm as functions of the initial contents of the RAM.

Example: By applying the transformations of the point a- on the example algorithm AL0 we obtain the following algorithm:

|    | Init'         | S1''                                    | S2''                              |
|----|---------------|-----------------------------------------|-----------------------------------|
| C1 | R(a1) W(a1)   | R(a1) W($\overline{a_1}$) R($\overline{a_1}$) W(a1) | R(a1) W($\overline{a_1}$) W(a1) W($\overline{a_1}$) |
| C2 | R(a2) W($\overline{a_2}$) | R($\overline{a_2}$) W(a2) W($\overline{a_2}$) W(a2) | R(a2) W($\overline{a_2}$) — —     |
| C3 | R(a3) W(a3)   | R(a3) W($\overline{a_3}$) R($\overline{a_3}$) W(a3) | R(a3) W($\overline{a_3}$) W(a3) W($\overline{a_3}$) |

By applying the transformations of the point b- on the example algorithm AL1 we obtain the following algorithm:

|    | S1''                                                  | S2''                                            |
|----|-------------------------------------------------------|-------------------------------------------------|
| C1 | R(a1) W($\overline{a_1}$) R($\overline{a_1}$) W(a1)   | R(a1) W($\overline{a_1}$) W(a1) W($\overline{a_1}$) |
| C2 | R(a2) W($\overline{a_2}$) W(a2) W($\overline{a_2}$)   | R($\overline{a_2}$) W(a2) — —                   |
| C3 | R(a3) W($\overline{a_3}$) R($\overline{a_3}$) W(a3)   | R(a3) W($\overline{a_3}$) W(a3) W($\overline{a_3}$) |

Let AL2 be the algorithm representation resulting by the step 2. In this algorithm, the expected data of each read operation of a cell is equal to either the initial data of the cell or to its inverse. Also the expected data to be used by each write operation of a cell is equal either to the initial data of the cell or to its inverse.

Then use the step 3.

Step 3: If the expected data for the last write operation of some cells are equal to the inverse of their initial data, then, add in the end of the algorithm a sequence which performs to each of these cells a read operation followed by a write operation with data the inverse of the read data.

Obviously after this step the RAM contents are equal to the initial contents.

Example: by applying the step 3 on the example algorithm AL2 resulting by the step 2b we obtain the following algorithm:

|    | S1''                                                  | S2''                                              | S3''                            |
|----|-------------------------------------------------------|---------------------------------------------------|---------------------------------|
| C1 | R(a1) W($\overline{a_1}$) R($\overline{a_1}$) W(a1)   | R(a1) W($\overline{a_1}$) W(a1) W($\overline{a_1}$) | R($\overline{a_1}$) W(a1)       |
| C2 | R(a2) W($\overline{a_2}$) W(a2) W($\overline{a_2}$)   | R($\overline{a_2}$) W(a2) — —                     | — —                             |
| C3 | R(a3) W($\overline{a_3}$) R($\overline{a_3}$) W(a3)   | R(a3) W($\overline{a_3}$) W(a3) W($\overline{a_3}$) | R($\overline{a_3}$) W(a3)       |

The algorithm AL3 resulting by the step 3 is a transparent test algorithm, and will be called the basic transparent test algorithm.

The last step is used in order to determine an algorithm allowing to predict the signature produced by the basic transparent test algorithm. The resulting algorithm will be called signature prediction algorithm. Alternatively we can determine an algorithm (called signature initialization algorithm) which allows to initialize an Up/Down output data compactor to a state such that: after the application of the basic transparent test algorithm, the final signature is equal to the initial state of the compactor, and thus it is predictable. The Up/Down output data compactors will be described later.

Step 4: Delete all the write operations from the algorithm AL3.

Example: by applying the step 4 on the example algorithm AL3 we obtain the following algorithm:

|    | S1°         | S2°    | S3°    |
|----|-------------|--------|--------|
| C1 | R(a1) R(a1) | R(a1)  | R(a1)  |
| C2 | R(a2)       | R(a2)  | —      |
| C3 | R(a3) R(a3) | R(a3)  | R(a3)  |

Let AL3° be the algorithm resulting by step 4. Let AL4 be the concatenation of the algorithms AL3° and AL3. The algorithm AL4 can be used to implement the transparent BIST. During the algorithm AL3° some of the read data will be inverted before to be injected to the signature analyzer. This inversion is used if the respective read data in the algorithm AL3 are equal to the inverse of the initial contents of the RAM. Then we can verify easily that the expected signatures of the algorithms AL3° and AL3 are equal and the RAM can be verified by comparing these signatures. Alternatively we can inject the read data of the algorithm AL3° without inversion, and invert the respective data of AL3. Note that the last sequence of AL3° (sequence S3° in the example) can be removed, since the last sequence of the algorithm AL3 (sequence S3' in the example) is useless by the fault coverage point of view, and thus we do not need to compute the signature during this sequence.

Alternatively we can use a signature initialization algorithm coupled with un Up/Down signature analyzer. The order of this algorithm is the reverse of the signature prediction algorithm.

Example: by reversing the order of the algorithm AL3 we obtain the signature initialization algorithm AL3*:

|    | S3*    | S2*    | S1*         |
|----|--------|--------|-------------|
| C1 | R(a3)  | R(a3)  | R(a3) R(a3) |
| C2 | —      | R(a2)  | R(a2)       |
| C3 | R(a1)  | R(a1)  | R(a1) R(a1) |

Obviously the order of this algorithm is the reverse of the one of the algorithm AL3°.

In the case of the signature initialization algorithm the output response compaction will be performed by an Up/Down signature analyzer (or more generally by an Up/Down output response compactor), described later. The data read during the signature initialization algorithm (AL3*) are injected to the Up/Down output response compactor. Similarly to the signature prediction algorithm, some data of the algorithm AL3* (or alternatively some data of the algorithm AL3) are inverted before to be injected to the compactor. The inverted data are the same as in the case of the signature prediction algorithm. During this phase the compactor is on the Down mode (resp. Up mode). Then, the data read during the basic transparent test algorithm (algorithm AL3) are injected to the compactor. During this phase the compactor is on the Up mode (resp. Down mode). According to the basic property of the Up/Down data compactors (see later), the final state of the output data compactor is equal to its initial state, and thus it is predictable.

Note also that the signature prediction can be performed in some alternative ways. For instance in the string R(a1)R(a1) of the sequence S1° we can delete one read. This modification will be compensated by injecting twice in the output compactor the data of the remaining read. Thus we still inject the same data in the output compactor during both the signature prediction algorithm and the basic transparent test algorithm. Of course, as previously, some of the injected data will be inversed. More generally, if the signature prediction algorithm includs some string of k consecutive reads of a cell ci, then, we can delete m reads in this string (m<k). This modification will be compensated by injecting k data in the output compactor using the data of the remaining k–m reads. This remark applies also to the signature initialization algorithm.

Step 5: Let bi, ci, di ... be the data read from the cell i during the 2nd, 3rd, 4rth etc. read operations of the algorithm AL3. Since the data of the write operations have been determined with respect to ai, the values of bi, ci, di ... are also determined with respect to ai (i.e. bi=ai, or bi= $\overline{a_i}$, ci=ai, or ci=$\overline{a_i}$ etc.). Then, we use bi and $\overline{b_i}$ as data in the string of write operations following the second read operation of the cell i, ci and $\overline{c_i}$ as data in the string of write operations following the 3rd read operation of the cell i, etc... For instance, if in the string of write operations which follows the 2nd read operation, the data of a write operation is ai (resp. $\overline{a_i}$), then, if bi=ai we use the value bi (resp. $\overline{b_i}$) for this operation, otherwise we use the value $\overline{a_i}$ (resp. bi).

Example: by applying the step 5 on the example algorithm AL3 we obtain the following algorithm:

|    | S1'''                                                    | S2''                                                | S3''                              |
|----|----------------------------------------------------------|-----------------------------------------------------|-----------------------------------|
| C1 | R(a1) W($\overline{a_1}$) R(b1) W($\overline{b_1}$)      | R(c1) W($\overline{c_1}$) W(c1) W($\overline{c_1}$) | R(d1) W($\overline{d_1}$)         |
| C2 | R(a2) W($\overline{a_2}$) W(a2) W($\overline{a_2}$)      | R(b2) W($\overline{b_2}$) — —                       | — —                               |
| C3 | R(a3) W($\overline{a_3}$) R(b3) W($\overline{b_3}$)      | R(c3) W($\overline{c_3}$) W(c3) W($\overline{c_3}$) | R(d3) W($\overline{d_3}$)         |

The algorithm obtained by the step 5 involves the same expected values for all the read and the write operations as the algorithm AL3. This can be verified easily by establishing the relationships between ai and bi, ai and ci etc. (these relationships can be established by comparing the read values in the two algorithms). The transformation of the step 5 is useful in order to illustrate that in each string of write operations we use as write data the data of the read operation preceding the write ones (or their complements). To do that the read data will be stored in some register. Also this transformation highlights the fact that for a faulty RAM, the erroneous data read from some cell will influence the data of the following write operations of the cell (while in a standard algorithm the data used in the write operations are always correct). Thus the step 5 is used only for didactical reasons.

Note that the basic transparent test algorithm can be implemented in several ways. For instance the string $R(a1)W(\overline{a_1})R(b1)W(\overline{b_1})$ of the sequence S1" means that: we read the cell C1 and we store the resulting value a1 in the test data register, then we write in C1 by using the inverse of the stored value a1, then we read C1 and we store the resulting value b1 in the test data register (under the fault free condition it should be $b1=\overline{a_1}$), and finally we write in C1 the inverse of the stored value b1. Alternatively we can use the string $R(a1)W(\overline{a_1})R(b1)W(a1)$. This means that we read C1 and we store the resulting value a1 in the test data register, then we write in C1 the inverse of the stored value a1, then we read C1 (the read value b1 is observed, e.g. injected in the output data compactor, but it is not stored in the test data register), and we write in C1 the value stored in the test data register (which in the present case is the value a1 of the first read). That is, if several reads are included in a string of consecutive operations affecting a cell ci, we can use only a subset of the read data in order to generate the write data.

The transparent BIST based on the algorithm AL4 can be implemented by modifying the BIST circuitry used for the normal BIST based on the algorithm ALin. A systematic reviewing of the RAM test algorithms shows that in generally, the steps 0 and 3 are not needed. In fact in these algorithms the first operation of each addressed cell is a read one, and thus the step 0 is not needed. This coincidence is due to the fact that starting with a read operation is very efficient in particularly for coupling and pattern sensitive faults, which are the predominant faults in RAMs. This is because if one starts with a write operation one looses the effect that have on the faulty cells the previous transitions on some other cells, or the particular patterns contained previously by some other cells. On the other hand, the reviewing of the known algorithms shows that if one deletes the initialization sequence (resp. the initialization operations), these algorithms involve the same number of $0 \rightarrow 1$ and $1 \rightarrow 0$ transitions. This fact implies that at the end of the step 2 the RAM contents are equal to the initial contents and step 3 is not needed. This fact is due to some symmetric property of the RAM fault models with respect to the 0 and 1 contents of each cell and with respect to the $0 \rightarrow 1$ and $1 \rightarrow 0$ transitions. This property is presented later.

After the above discussion we can see that the sequencing of the algorithm AL3 is slightly more complex than the sequencing of the algorithm ALin and so the BIST circuitry will. On the other hand, the algorithm AL3° is obtained from AL3 by deleting the write operations. Thus we can use the same BIST circuitry as for the algorithm AL3 but during the execution of AL3° we block the write operations. This will be illustrated later for the Marinescu's algorithm transparent BIST, by using a simple modification of the instance generator. We conclude that the transparent BIST circuitry will be slightly more complex than the normal BIST one. Similarly, after some slight modifications, the algorithm AL3* can be obtained by using the circuitry generating the algorithm AL3.

The open question is now the fault coverage offered by the transparent BIST. In the following we show that for the more of the known RAM fault models the fault coverage is the same as for the initial algorithm. In this analysis we do not take into account the aliasing problem inherent to the use of an output response compactor which is common to almost all the BIST schemes.

Lemma 1: The steps 0 and 4 do not alter the fault coverage of the algorithm.

This lemma holds because for all the known fault models, the read operations do not involve the modification of the value of any RAM cell (e.g. see the RAM fault models presented previously). On the other hand the steps 0 and 4 add only read operations in the algorithm.

Lemma 2: The step 3 does not alter the fault coverage of the algorithm.

This lemma holds because the step 3 performs some supplementary read and write operations after the end of the basic algorithm, thus if a fault produces an erroneous output during the basic algorithm the new operations can not mask it.

Another problem is due on the fact that the signature of the algorithm AL3 is not verified against a precomputed signature but against a signature computed by using data generated by the RAM itself (i.e. algorithm AL3°). Thus one can suppose that some faults in the RAM can be generate the same erroneous outputs during both the AL3 and AL3° (or during both the AL3 and AL3*), and the fault will be therefore masked, as happens in the case of the Koeneman's technique. The following lemma copes with this problem.

Lemma 3: The comparison of the signatures generated during the algorithms AL3° and AL3 can not mask the detection of any fault.

Proof: Let ai be the data read for the first time by the algorithm AL3° in a cell ci. For all the known RAM fault models the read operation of any cells ck1, ck2, . . . ckr can not change the value of the data read to any other cell ci. Since the algorithm AL3° performs only read operations, then, each time we read the cell ci during the algorithm AL3° the read value will be ai and this is true for every cell ci of the RAM. If the algorithm AL3 detects a fault (this means that the value read to some cell ci in some instance of AL3 will be different from the expected value ai or $\overline{a_i}$), then, during the algorithms AL3° and AL3 we inject to the output response compactor different data. Q.E.D.

Lemma 4: The signature verification scheme which uses the signature initialisation algorithm AL3* and an Up/Down output data compactor can not mask the detection of any fault.

Proof: this lemma can be shown similarly to lemma 3.

Of course, in the above lemmas we do not consider the aliasing problem (i.e. the output response compactor gives the same signature for both the expected output response and the erroneous output response of the algorithm AL3). This problem concerns any scheme using an output response compaction and it is not specific to the transparent BIST.

In the following we give some very general results allowing to verify easily if the step 2 affects the fault coverage of the original algorithm. At first we give a symmetric property which is inherent to the more of the RAM fault models. This property is very important since as we show later in theorem 1, if the fault model verifies this property then the step 2 does not decrease the fault coverage of the algorithm.

Symmetric property (S.P.): Let a fault model F and let any fault f∈F which involves the states $s_1, s_2, \ldots, s_{k1}$ of some cells $C_1, C_2, \ldots, C_{k1}$ and the transitions $t_{k1+1}, t_{k1+2}, \ldots, t_{k1+k2}$ of some cells $C_{k1+1}, C_{k1+2}, \ldots, C_{k1+k2}$. Then the faults which are derived from f by inversing any collection of the states $s_1, s_2, \ldots, s_{k1}$ and any collection of the transitions $t_{k1+1}, t_{k1+2}, \ldots, t_{k1+k2}$ of the above cells, belong to the fault model F.

In the following we will show that this property is respected by the known RAM fault models. These fault models have been presented previously.

For single stuck-at faults the transformations involved by the symmetric property transform a stuck-at 0 to a stuck-at 1 fault and a stuck-at 1 to a stuck-at 0 fault which are both stuck-at faults. It is also obvious that any collection of the transformations involved by the S.P. transform any multiple stuck-at fault to another multiple stuck-at fault. Thus the property holds for the single and multiple stuck-at fault model. A transition fault which involves the transition S→$\bar{S}$ of a cell will be transformed to the transition fault which involves the transition $\bar{S}$→S of the same cell. Then, any collection of the transformations involved by the S.P. applied to a multiple transition fault will transform some of these transitions faults to some other transition faults and will let unchanged some other transition faults. Thus the S.P. holds for the single and multiple transition fault model.

Applying any collection of the transformations involved by the S.P. to some coupling fault T(is,jt) will result to a coupling fault T(is',jt'). Applying any collection of these transformations to a multiple coupling fault will modify some of the coupling faults to some other coupling faults and will let unchanged some other coupling faults. The resulting fault is a multiple coupling fault. Thus the single and multiple coupling fault model respect the S.P.

Similarly, applying any collection of the transformations involved by the S.P. to a ANPSF fault $AN(i_s, j_t, 1_{s1}, 2_{s2}, \ldots, k_{sk})$ will transform it to a fault $AN(i_s', j_t', 1_{s1}', 2_{s2}', \ldots, k_{sk}')$ which belongs to the fault model. This can be easily extented to the multiple ANPSF faults. Thus the S.P. holds for the single and multiple active pattern sensitive fault model.

Applying any collection of the transformations involved by S.P. to a passive pattern sensitive fault $PN(i_s, 1_{s1}, 2_{s2}, \ldots, k_{sk})$ results to a passive pattern sensitive fault $PN(i_s', 1_{s1}', 2_{s2}', \ldots, k_{sk}')$. This can be easily extended to the multiple passive pattern sensitive faults. Thus the S.P. holds for the single and multiple passive pattern sensitive fault model.

Then one can verify easily that a fault model which combines any of the above fault models verifies the symmetric property.

Similar arguments can be used for the single and multiple static and dynamic pattern sensitive fault models defined in "SALUJA K.K., KINOSHITA K.—"Test pattern generation for API faults in RAM. IEEE Transactions on Computers C-34,3 March 1985", and for the single and multiple complex coupling and concurrent coupling fault models which are introduced recently for multiport RAMs in "CASTRO ALVES V., NICOLAIDIS M, LESTRAT P., COURTOIS B., "Built-In Self-Test for Multi-Port RAMs", Proc. ICCAD, Santa Clara, November 1991". More generally we remark that the transformations involved by the symmetric property change only the particular values of the states and of the transitions involved by a fault and thus they produce a fault of the same nature as the original one. Thus if the fault model is complete, then, starting from a fault of the fault model and applying the transformations involved by the symmetric property, produces a fault which belongs to the fault model. Thus the following proposition holds.

Proposition 1: The symmetric property is verified by the complete RAM fault models.

The above fault models are complete (e.g. the coupling fault model includes all the coupling faults). However, if the fault model is reduced the symmetric property can be lost. For instance if the fault model includes the coupling fault T(i0, jt) but it does not include the fault T(i1, jt) the S.P. does not hold. Some fault models proposed in the literature are reduced, either because the algorithms required for the complete fault model are very complex, or because some faults of the model are unrealistic.

For the more of the reduced fault models used in the literature the S.P. still holds. The reason is that none of the states 0 and 1 and of the transitions 0→1 and 1→0 has been considered to be more significant than the other one. The above discussion is exemplified by two known reduced fault models. The one conserves the S.P. property while the second does not. An important reduced fault models is the coupling fault model considered in "Marinescu M. "Simple and efficient algorithms for functional RAM testing", IEEE International Test Conference, November 1982" which exclude the inverting coupling faults. This reduction can be justified by the fact that inverting couplings involve very complex test algorithms while these faults are unrealistic. More precisely this paper considers single and multiple coupling faults but it excludes the multiple ones which contains both the fault T(i0, jt) and T(i1, jt) (i.e. he excludes the inverting coupling faults). We will show that the S.P. holds for this model: If the transformations involved by the S.P. are applied to non-inverting couplings, they never produce inverting couplings (i.e. a multiple fault which includes two faults $T(i_{s1'}, j_{t1'})$ and $T(i_{s2'}, j_{t2'})$ such that s1'+ s2 ' and t1'+t2'). The initial fault must contain two faults $T(i_{s1}, j_{t1})$ and $T(i_{s2}, j_{t2})$ otherwise the transformation involved by S.P. will never produces the above mentioned faults. Since the starting fault belongs to the fault model we can not have s1=$\bar{s2}$∧t1=t2. From the transformations involved by the S.P. and which will produce the fault $T(i_{s1'}, j_{t1'})$ & $T(i_{s2'}, j_{t2'})$ we have:

$$(s_1'=s_1 \wedge s_2'=s_2) \vee s_1'=\overline{s1} \wedge s_2'=\overline{s_2}) \text{ and } (t_1'=t_1 \wedge t_2'=t_2) \vee (t_1'=\overline{t1} \wedge t_2'=\overline{t2}).$$

By these relationships and since we can not have s1=$\bar{s2}$ and t1=t2, we find easily that we can never have s1'= $\bar{s2}$'∧t1'=t2'. Then the faults resulting form the transformation S.P. belong to the fault model and the S.P. holds.

A similar reasoning can be used for the single and multiple complex coupling fault model reduced by removing inverting complex coupling faults as considered in "CASTRO ALVES V., NICOLAIDIS M, LESTRAT P., COURTOIS B., "Built-In Self-Test for Multi-Port RAMs", Proc. ICCAD, Santa Clara, November 1991".

"Papachristou C. A., Sahgal N. B., "An Improved Method for Detecting Functional Faults in Semiconductor Random Access Memories", IEEE Transactions on Computers, Vol C-27, pp 572–576, June 1978" considers another reduced model of coupling faults. In this paper the interacting coupling faults are excluded. Interacting coupling faults are called the multiple coupling faults $T(i_{s1}, j_{t1})$ & $T(i_{s2}, k_{t2})$ such that t1 =t2 and s1=$\bar{s2}$. We note that the fault $T(i_s, j_t)$ & $T(i_{\bar{s}}, k_{\bar{t}})$ is not interacting. Then, if we apply on this fault the transformation which inverts the transitions of the cell k, we obtain the fault $T(i_s, j_t)$ & $T(i_{\bar{s}}, k_t)$ which is interacting. Thus removing the interacting coupling faults breaks the symmetry. The S.P. does not hold for this model. In that case there is not guaranty that the transparent test algorithm offers the same fault coverage as the original algorithm. We conclude that the transparent BIST for coupling faults must be based on the Marinescu's algorithm. However this is not a significant constraint, the algorithm of Marinescu seems to be more efficient for coupling faults. In fact, as we have explained, it is reasonable to consider that inverting couplings can't occur (i.e. both the faults $T(i_s, j_t)$ and $T(\bar{i}_s, j_t)$, can not occur), but there is no particular reason to consider that interacting faults can not occur (i.e. both the faults $T(i_s, j_t)$ and $T(\bar{i}_s, k_t)$ j≠k can not occur).

By the above discussion we have the following proposition:

Proposition 2: Some reductions of the RAM fault models can break the symmetric property.

A popular type of reduction is the topological one. This reduction removes faults which involve interactions between cells which are not neighbors. This is a realistic reduction and is often used in the case of faults for which the complete fault model involves very complex test algorithms (e.g. the well known pattern sensitive fault model and the more recent complex coupling fault model "CASTRO ALVES V., NICOLAIDIS M, LESTRAT P., COURTOIS B., "Built-In Self-Test for Multi-Port RAMs", Proc. ICCAD, Santa Clara, November 1991"). We note that if one applies to some fault f any of the transformations involved by the symmetric property, the resulting fault f' does not involves interactions between cells for which the fault f does not involve interactions. Thus if the fault f involves interactions between only neighbor cells the fault f' will too. Thus we have the following proposition.

Proposition 3: If the initial fault model verifies the symmetric property then the fault models produced by any topological reduction will verify this property.

More particularly the topological reduction of the single and multiple pattern sensitive fault model gives a fault model which respect the symmetric property. Also the single and multiple complex coupling fault model resulting by removing the inverting complex couplings and by applying the topological reduction (as in "CASTRO ALVES V., NICOLAIDIS M, LESTRAT P., COURTOIS B., "Built-In Self-Test for Multi-Port RAMs", Proc. ICCAD, Santa Clara, November 1991"), verifies the symmetric property. Thus, the transparent BIST does not decrease the fault coverage for these fault models.

Now we give the theorem 1.

Theorem 1: If the fault model verifies the symmetric property, then the algorithm resulting after the application of the steps 0, 1 and 2 does not decrease the fault coverage of the initial algorithm.

Proof: Let us consider a RAM fault model F which verifies the S.P. and a test algorithm ALin which offers a a % coverage over this model. Let us apply the steps 0, 1, and 2 over this algorithm and let AL be the resulting algorithm after the step 0 and let AL' be the resulting algorithms after the step 2. As shown in lemma 1 the step 0 does not decrease the fault coverage of the original algorithm. Thus we have to compare the coverage of the algorithms AL and AL'.

If the step 1 deletes the initialization sequence (resp. the initialization operations), this sequence (resp. these operations) is (are) useless by the fault excitation point of view. Thus when in the following we compare the states and transitions of the algorithms AL and AL', we do not consider the states and transitions occurring during this sequence.

If the step 1 does not delete the initialization sequence (resp. the initialization operations), then in the initial algorithm ALin, the transitions involved in the initialization sequence (resp. the initialization operations), are undetermined (since before these operations the contents of the RAM are unknown). Thus these transitions can not be useful by the fault excitation point of view. Therefore, when in the following we compare the transitions of the algorithms AL and AL', we do not consider these transitions.

Let 1,2,3 . . . , n be the memory cells and a1, a2, a3, . . ., an their initial states. Let the initial state of a cell k be ak, and let rk be the data of the first read operation in the sequence S1' of the algorithm AL0. If (in the case a- of step 2) ak=0, or if (in the case b- of step 2) ak=rk, then, the step 2 preserves the state and the transition values (of the cell k) involved in the algorithm AL, otherwise the step 2 inverts all these state and transition values. Let consider a fault f belonging to F, being detectable by AL and involving the states $s_{k1}, s_{k2}, \ldots, s_{ki}$ on the cells k1, k2, . . . , ki and the transitions $t_{ki+1}, t_{ki+2}, \ldots, t_{ki+j}$ on the cells ki+1, ki+2, . . . , ki+j. Let $ak_1, ak_2, \ldots, ak_i, ak_{i+1}, ak_{i+2}, \ldots, ak_{i+j}$ be the initial states of the these cells. It is possible for a fault that the sets S={k1,k2, . . . , ki} and T={ki+1, ki+2, . . . , ki+j} have some common elements.—Also in the above description we consider that each of these sets can have some double elements. This is because a multiple fault can involve both the 0 and the 1 states, or both the 0→1 and the 1→0 transitions of a cell.—Let us now consider a fault f' such that $\forall q \in S$: if (in the case a- of step 2) ak=0, or if (in the case b- of step 2) ak=rk, f' involves the state sq'=sq, otherwise f' involves the state sq'=$\overline{sq}$, and such that $\forall p \in T$: if (in the case a- of step 2) ap=0, or if (in the case b - of step 2) ap=rp, f' involves the transition tp'=tp, otherwise f' involves the transition tp'=$\overline{tp}$.

The first element of the proof is obvious: the above mapping does never map two different faults f1 and f2 to the same fault f'.

The second element of this proof is that AL' detects f': We note that the detection of the faults f and f' is not affected by the states of cells which do not belong to S and by the transitions of cells which do not belong to T. Thus we have not to wary about the modifications of the states and transitions involved to these cells by step 2. Then, we remark that both the transformations f→f' and AL→AL' involve the same modifications on the states of the set S and on the transitions of the set T. Thus we can conclude that if AL detects f then AL' detects f'. There is however a subtle remark on this claim. The modifications on the mentioned states and transitions involved by AL→ AL' will be the same as the ones involved by f→f' if the algorithms are performed to a fault free RAM. In a faulty RAM the data written during the algorithm AL are generated externally (thus they are equal to the data defined by the algorithm AL), while the data written during the algorithm AL' are the data read from the RAM and can be different for the fault free and for the faulty RAM (this situation becomes more clear if one considers the algorithm resulting by the step 5).Thus in a faulty RAM the correspondence between the transformations AL→AL' and f→f' can be lost. This problem however can not prevent the detection of f'. The reason is that: if the algorithm AL' writes an incorrect data this is also an incorrect read data. Thus again AL' detects f'. Since f belongs to F and F verifies the symmetric property, f' belongs to F too.

In a similar way we can show that to each fault f' belonging to F and detected by AL' corresponds one and only one fault f belonging to F and detected by AL. Thus there is a one-to-one correspondence between the faults detected by the two algorithms so that they detect the same number of faults of the fault model F and thus they offer the same (a%) fault coverage. In particularly if the original algorithm detects all the faults of the model, the algorithm resulting after the steps 0, 1, and 2 will detect all the faults too.

Corolary 1: If the fault model verifies the symmetric property, then the algorithm resulting by inversing all the data of any given set of cells used in a RAM test algorithm, does not decrease the fault coverage of the initial algorithm.

This coralary comes easily from the proof of theorem 1.

Finally in the following theorem we show that the verification of the symmetric property is necessary in order to ensure that there is not decreasing of the fault coverage.

Theorem 2: If the fault model covered by a RAM test algorithm AL does not verify the symmetric property, then the resulting transparent test algorithm decrease the fault coverage.

Proof: From theorem 2 there are at least two faults f and f' such that:

a—f is covered by the test algorithm AL, b—there is a set of transformations involved by the symmetric property which transform the fault f to f', c—the fault f' is not detected by the test algorithm AL.

Let AL' be the algorithm resulting from the step 2. Then by using the ideas of the proof of theorem 1 we can find an initial state of the RAM such that both the transformations f→f' and AL→AL' involve the same state and transition modifications. Then, by a reasoning similar to the proof of theorem 1 we can check easily that: f' is undetectable by AL implies that f is undetectable by AL'. Since the RAM can have any initial contents the Transparent test algorithm does not ensure the coverage of the fault f.

From Lemmas 1, 2, 3 and 4 and theorem 1 it is obvious that: if the fault model verifies the symmetric property, then, the transparent test algorithms derived in this paper does not decrease the fault coverage of the standard RAM test algorithms. For instance, the transparent BIST implementation illustrated below and based on the Marinescu's algorithm does not alter the fault coverage of the original algorithm.

The inverse transformations:

Let us consider that one posses a transparent RAM test algorithm but he does not know the standard RAM test algorithm from which it has been derived. The inverse transformations allows to determine the set of the standard algorithms from which the transparent one can be derived.

Let us consider a RAM transparent test algorithm which consist on the basic algorithm only (the signature prediction sequences have been removed).

Let us consider that the data used in the write operations of the transparent test algorithm are the data $a_i$ resulting by the first read operation of each cell i and its inverse $\bar{a}_i$ (like for instance in the algorithms derived by using the transformation steps 0, 1, 2, and 3).

Step $\bar{2}$: this step performs the inverse transformation of the step 2, that is to say we replace the variables $a_i$ by 0 and the variable $\bar{a}_i$ by 1. Alternatively we can use the dual transformations (i.e. replace $a_i$ by 1 and $\bar{a}_i$ by 0).

Step $\bar{0}$: In the algorithm resulting by the above step, let a string of operations be the set of operations applied successively on a cell i. Let consider the set of strings starting by read operation. Remove any collection of these read operations to obtain a new algorithm. This step is the inverse of step 0. We obtain several algorithms according to the collection of the removed read operations.

Step $\bar{1}$: Let us consider the algorithm resulting from step $\bar{2}$ or any algorithm resulting by applying the step $\bar{2}$ followed by the step $\bar{0}$. If in the considered algorithm the first operation of some cells is a read one, then, add an initialization sequence. Alternatively, add an initialization operation (i.e. a write operation) before each of these read operations. The initialization sequence is composed by a set of write operations which allow to set the states of the memory cells to the values expected for the first read operations. This step is the inverse of step 1.

The algorithms resulting after the application of the step $\bar{1}$ are standard RAM test algorithms (i.e. they use the known binary values 0 and 1).

Step $\bar{3}$: Let us consider the algorithm resulting by applying the step $\bar{2}$ followed by the step $\bar{1}$ or any algorithm resulting by applying the step $\bar{2}$ followed by the step $\bar{0}$ followed by the step $\bar{1}$. If some string of operations affecting a cell and involved in the last sequence of the algorithm is composed by a read operation followed by a write one, then, remove any collection of such strings. This step is the inverse of step 3. We obtain several algorithms according to the collection of the removed strings.

Step $\bar{5}$: This step is the inverse of the step 5. Let us consider an algorithm (like for instance the one derived by the step 5 of the direct transformations), which is described by using for each write operation of a cell i the data (or the inverse data) of the last read operation of the cell i preceding the write operation. This means that the write operations use the data $a_i$, $b_i$, $c_i$, $d_i$, etc. of the first, second, third, fourth etc. read operations and their inverses $\bar{a}_i$, $\bar{b}_i$, $\bar{c}_i$, $\bar{d}_i$, etc. Since the write operations following the first read one use the values $a_i$ or $\bar{a}_i$, then, one can determine the value $b_i$ of the second read operation with respect to $a_i$ (i.e. $b_i=a_i$ or $b_i=\bar{a}_i$). In the same way one can determine the value of $c_i$ with respect to $a_i$ and so on. Then, the step $\bar{5}$ consists on replacing the values $b_i$, $\bar{b}_i$, $c_i$, $\bar{c}_i$, $d_i$, $\bar{d}_i$, etc. by the values $a_i$, $\bar{a}_i$, established as previously.

The algorithm obtained by applying the step $\bar{2}$ followed by step $\bar{1}$ (or by applying the step $\bar{5}$ followed by steps $\bar{2}$ and $\bar{1}$) will be called the covering non transparent algorithm. The algorithms obtained by applying the steps $\bar{2}$, $\bar{0}$, $\bar{1}$ or the steps $\bar{2}$, $\bar{1}$, $\bar{3}$ or the steps $\bar{2}$, $\bar{0}$, $\bar{1}$, $\bar{3}$ (or by applying the step $\bar{5}$ followed by these steps) will be called the covered non transparent algorithm.

The fault coverage can been determined easier for a standard RAM test algorithm than for a transparent one. If one posses a transparent test algorithm but he does not know the standard one from which it is derived, then, in order to determine the fault coverage of the transparent one he can first determine the fault coverage of the covering standard test algorithm (i.e. the one derived by applying the step $\bar{2}$ followed by the step $\bar{1}$ as above).

If the fault model verifies the symmetric property, then from the proof of theorem 1 we can derive easily that the covering algorithm and the transparent one involve the same fault coverage. Thus we determine the fault coverage of the transparent test algorithm.

Example

An example of a Transparent test algorithm derived by using our technique and its BIST implementation are presented in the following in the basis of the Marinescu's RAM test algorithm. The algorithm B (given in Marinescu M. "Simple and efficient algorithms for functional RAM testing", IEEE International Test Conference, November 1982) is given in table 1. This algorithm performs 17.n read and write operations (n is the RAM size), and covers all the single and multiple stuck-at faults and idempotent coupling faults.

TABLE I

Algorithm B of Marinescu.

| Init. | S1 | S2 | S3 | S4 |
|---|---|---|---|---|
| $W_0$ | $R_0W_1W_0W_1$ | $R_1W_0R_0W_1$ | $R_1W_0W_1W_0$ | |
| $R_0W_1R_1W_0$ | | | | |
| $W_0$ | $R_0W_1W_0W_1$ | $R_1W_0R_0W_1$ | $R_1W_0W_1W_0$ | $R_0W_1R_1W_0$ |
| $W_0$ | $R_0W_1W_0W_1$ | $R_1W_0R_0W_1$ | $R_1W_0W_1W_0$ | $R_0W_1R_1W_0$ |
| . | . | . | . | . |
| $W_0$ | $R_0W_1W_0W_1$ | $R_1W_0R_0W_1$ | $R_1W_0W_1W_0$ | $R_0W_1R_1W_0$ |

---> time

The above algorithm considers bit-oriented RAMs. In the case of word-oriented RAMs one writes simultaneously into several RAM cells. Thus some new faults can appear. For instance when we perform simultaneous transitions in two cells ci and cj these transitions can modify the value of a third cell ck. We call these faults complex coupling faults "CASTRO ALVES V., NICOLAIDIS M, LESTRAT P., COURTOIS B., "Built-In Self-Test for Multi-Port RAMs", Proc. ICCAD, Santa Clara, November 1991". Also when we perform simultaneous transition into two cells ci and cj the transition of the one cell can prevent the transition of the other cell. This fault is called concurrent coupling fault "CASTRO ALVES V., NICOLAIDIS M, LESTRAT P., COURTOIS B., "Built-In Self-Test for Multi-Port RAMs", Proc. ICCAD, Santa Clara, November 1991". Such faults can appear for instance in the case each RAM row implements a single word as in FIG. 2a. In this figure we see that a cell of a word (e.g. word b) has three neighbour cells belonging to some other word (e.g. word a). Thus we must test the RAM for the eight possible transitions (i.e. 000→111, 111→000, 001→110, 110→001, 010→101, 101→010, 011→100, and 100→011) of any three consecutive cells of each word. This can be done by performing the algorithm of table I four times, and by using each time one of the following data couples (000000 ... 000 ..., 111111 ... 111 ...), (001001 ... 001 ..., 110110 ... 110 ...), (010010 ... 010 ..., 101101 ... 101 ...), and (011011 ... 011 ..., 100100 ... 100 ...). If the RAM is implemented by using a 1-out-of-2 column multiplexing, then, each row of the RAM implements two words as shown in FIG. 2b. We remark that in that case a cell of a word (i.e. word a) can have at most two neighbour cells belonging to another word (i.e. word c). Thus we must test the RAM for the four possible transitions (i.e. 00→11, 11→00, 01→10, 10→01) of any two consecutive cells of each word. This can be done by performing the algorithm of table I two times, the first time we perform the algorithm by replacing the one bit data 0 and 1 by 0000 ... 00 ..., and 1111 ... 11 ..., then, we use a transition sequence during which we write the data 0101 ... 01 ... to all the RAM words and we perform the sequences S1, S2, S3, and S4 by using the data 0101 ... 01 ... and 1010 ... 10 ... If the RAM is implemented by using a 1-out-of-4 multiplexing, then, each row of the RAM implements four words as shown in FIG. 2c. We remark that in that case a cell of a word (i.e. word a) can have at most one neighbour cell belonging to another word (i.e. word e). Thus we need to test the RAM only for the two possible transitions (i.e. 0→1, 1→0) of each RAM cell. This can be done by performing the algorithm of table I one time, by using the data 0000 ... 00 ... and 1111 ... 11 ... This is also true for a greater order multiplexing (1-out-of-8, 1-out-of-16 etc ... ). In practice RAMs are generally implemented using column multiplexing of 1-out-of-4 or of greater order. Thus the algorithm of table I can be used. We just need to replace the write 1 and write 0 of a cell by write 1 or write 0 to all the word cells.

Let us now consider the algorithm of table I. By using the transformation steps 1 and 2, this algorithm is modified as shown in table II. In the sequence S1 of this table $R_{ai}$ means that we perform a read operation on the cell i and the read value is equal to ai (the initial value of cell i). In the other sequences $R_{ai}$ (resp. $R_{\bar{a}_i}$) means that we perform a read operation and the expected value is equal to ai (resp. $\bar{a}_i$). $W_{ai}$ and $W_{\bar{a}_i}$ means that we write ai or $\bar{a}_i$ in the cell i. We note that in the end of the algorithm the contents of the RAM are equal to its initial contents. Thus the algorithm is transparent.

TABLE II

Basic transparent test algorithm derived from the Marinescu's algorithm.

| S1 | S2 | S3 | S4 |
|---|---|---|---|
| $R_{a1}W_{\bar{a}_1}W_{a1}W_{\bar{a}_1}$ | $R_{\bar{a}_1}W_{a1}R_{a1}W_{\bar{a}_1}$ | $R_{\bar{a}_1}W_{a1}W_{\bar{a}_1}W_{a1}$ | $R_{a1}W_{\bar{a}_1}R_{\bar{a}_1}W_{a1}$ |
| $R_{a2}W_{\bar{a}_2}W_{a2}W_{\bar{a}_2}$ | $R_{\bar{a}_2}W_{a2}R_{a2}W_{\bar{a}_2}$ | $R_{\bar{a}_2}W_{a2}W_{\bar{a}_2}W_{a2}$ | $R_{a2}W_{\bar{a}_2}R_{\bar{a}_2}W_{a2}$ |
| $R_{a3}W_{\bar{a}_3}W_{a3}W_{\bar{a}_3}$ | $R_{\bar{a}_3}W_{a3}R_{a3}W_{\bar{a}_3}$ | $R_{\bar{a}_3}W_{a3}W_{\bar{a}_3}W_{a3}$ | $R_{a3}W_{\bar{a}_3}R_{\bar{a}_3}W_{a3}$ |
| . | . | . | . |
| $R_{an}W_{\bar{a}_n}W_{an}W_{\bar{a}_n}$ | $R_{\bar{a}_n}W_{an}R_{an}W_{\bar{a}_n}$ | $R_{\bar{a}_n}W_{an}W_{\bar{a}_n}W_{an}$ | $R_{an}W_{\bar{a}_n}R_{\bar{a}_n}W_{an}$ |

---> time

The algorithm of table II corresponds to a bit-oriented RAM. As we have seen, in the case of word oriented RAMs having an 1-out-of-4 or of greater order multiplexing the algorithm of table I must be performed by using the data 0000 ... 00 ... and 1111 ... 11 ... instead of the bit data 0 and 1. This will correspond to a transparent algorithm which performs the bit-oriented operations indicated in table II to all the bits of each word. Thus by using the above convention we can still consider the algorithm of table II.

For the word oriented RAMs which use an 1-out-of-2 column multiplexing or which do not use column multiplexing, we have seen that the standard (i.e. non trasparent) algorithm will be more complex. The corresponding transparent test algorithm can be obtained from these algorithms by applying the transformation steps.

In the following we consider the case of RAMs having an 1-out-of-4 or greater order multiplexing and thus we can use the algorithm of table II by making the above mentioned convention.

Concerning the signature prediction, we apply on the algorithm of table II the transformation step 4 and we obtain the algorithm of table III. The data read during the sequences of this algorithm will be injected to the output response compactor. Some times these data will be inverted in order to match with the data read during the sequences of table II (i.e. the data read during the first read operations of the sequences S2° and S3°, and the data mad during the second read operations of the sequence S4°, must be inverted before to be injected to the output data compactor).

TABLE III

| Signature prediction sequence. | | | |
|---|---|---|---|
| S1° | S2° | S3° | S4° |
| $R_{a1}$ | $R_{a1}R_{a1}$ | $R_{a1}$ | $R_{a1}R_{a1}$ |
| $R_{a2}$ | $R_{a2}R_{a2}$ | $R_{a2}$ | $R_{a2}R_{a2}$ |
| $R_{a3}$ | $R_{a3}R_{a3}$ | $R_{a3}$ | $R_{a3}R_{a3}$ |
| . | . | . | . |
| $R_{an}$ | $R_{an}R_{an}$ | $R_{an}$ | $R_{an}R_{an}$ |
| ---> time | | | |

The compaction scheme will be activated during the sequences S1°, S2°, S3° and S4° to predict the signature. The predicted signature is shifted out or it is stored in some internal register. Then the sequences of table II are executed. The new signature is compared (externally or internally) against the predicted one. We note that this response verification is valid for any compaction scheme and not only for the linear ones as in the technique proposed by B. Koeneman.

Alternatively we can use a signature initialization algorithm coupled with un Up/Down output data compactor. The order of this algorithm is the reverse of the signature prediction algorithm. Table IV presents the signature initialization algorithm corresponding to the Marinescu's test algorithm. Obviously the order of this algorithm is the reverse of the one of the algorithm of table III.

TABLE IV

| Signature initialization algorithm | | | |
|---|---|---|---|
| S4* | S3* | S2* | S1* |
| $R_{a1}R_{a1}$ | $R_{a1}$ | $R_{a1}R_{a1}$ | $R_{a1}$ |
| $R_{a2}R_{a2}$ | $R_{a2}$ | $R_{a2}R_{a2}$ | $R_{a2}$ |
| $R_{a3}R_{a3}$ | $R_{a3}$ | $R_{a3}R_{a3}$ | $R_{a3}$ |
| . | . | . | . |
| $R_{an}R_{an}$ | $R_{an}$ | $R_{an}R_{an}$ | $R_{an}$ |
| ---> time | | | |

In the case of the signature initialization algorithm the output response compaction will be performed by an Up/Down signature analyzer (or more generally by an Up/Down output response compactor), described later. The data read during the signature initialization algorithm are injected to the Up/Down output response compactor. Similarly to the signature prediction algorithm, some data of the signature initialization algorithm are inverted before to be injected to the compactor. The inverted data are the same as in the signature prediction algorithm. During this phase the compactor is on the Down mode (resp. Up mode). Then, the data read during the basic transparent test algorithm (table II) are injected to the compactor. During this phase the compactor is on the Up mode (resp. Down mode). According to the basic property of the Up/Down data compactors (see later), the final state of the output data compactor is equal to its initial state and thus it is predictable.

Concerning the fault coverage we have seen that the fault model covered by the algorithm of table I (i.e. single and multiple stuck-at faults and idempotent coupling faults), verifies the symmetric property. Thus the fault coverage is not reduced.

The transparent BIST implementation

The transparent BIST implementation based on the algorithms of tables III (signature prediction algorithm) and II is presented in the following. The transparent BIST implementation based on the algorithms of tables IV (signature initialization algorithm) and II is slightly different and it is not detailed here. However the design of of the Up/Down data compactors is inovative and will be described in details.

In order to simplify the BIST circuitry complexity we can use an hierarchical approach, that is we consider the different levels of hierarchy of the algorithm and we use a block to implement each level of hierarchy:

1—On the higher level of the hierarchy we have the eight sequences (S1°, S2°, S3° and S4°, S1, S2, S3 and S4) of the algorithms of tables II and III:

A 3-cell binary counter will be used as sequence control block. The first four states of the counter enable the sequences S1°, S2°, S3° and S4° of table III and the last four states enable the sequences S1, S2, S3 and S4 of table II. The signals S1', S2', S3' and S4' generated in FIG. 3 by the four NOR gates are equal to: S1'=S1°+S1, S2'=S2°+S2, S3'=S3°+S3, S4'=S4°+S4 and the signal S° is: S°=S1°+S2°+S3°+S4°.

2—Inside each sequence we need to generate the addresses of the different cells. In this level of hierarchy corresponds the address generator:

The algorithm of table I (and thus the ones of tables II and III) requires to address all the cells of the RAM. The order of the addressing is not significant (the algorithm is functional and thus independent on the topological implementation of the RAM). However if the RAM cells are addressed in some order during the sequences S1 and S2, then during the sequences S3 and S4 they must be addressed in the inverse order. This addressing can be performed by an Up/Down counter which is used in most of the known BIST schemes. In this study we will use the Up/Down LFSRs that we have introduced in (NICOLAIDIS, M. "An efficient Built-In Self-Test for functional test of embedded RAMs", In Proc. 15th International Symposium on Fault tolerant Computing, Ann Arbor, June 85, USA). This generator is more compact than the Up/Down counters, as claimed in the above paper. However the more significant improvement allowed by the Up/Down LFSRs is in the case the RAM is an embedded block. In that case the Up/down LFSR can be used as signature analyzer for some other block or it can be combined with a scan path or a boundary scan technique, as explained later.

An external XOR Up/Down LFSR of length n can be designed as following:

during the Up function the circuit is configured as a normal external XOR LFSR of length n.

during the Down function the shift direction is inverted (Up function: shift-right, Down function shift-left). The Down function feedback loop is derived from the feedback loop of the Up function as following:
  a) if the output of the cell Ck is used in the feedback loop of the Up function, then, the output of the cell Cm (with m=(k+1) mod n) is used in the feedback loop of the Down function,
  b) the output of the Down function feedback loop is used as an input to the nth cell.

An external XOR Up/Down LFSR of length 5 is given in FIG. 4a. This LFSR is derived from a normal LFSR (Up configuration) corresponding to the primitive characteristic polynomial $X^5+X^2+1$.

The internal XOR Up/Down LFSR of length n can be derived by a normal internal XOR LFSR as following:

If during the Up function the input of the cell Ck+1 is equal to An⊕Ak, then, during the Down function, the input of Ck is equal to A1⊕Ak+1 (Ai being the output of the cell Ci), otherwise the input of Ck is equal to Ak+1.

Figure 4B:
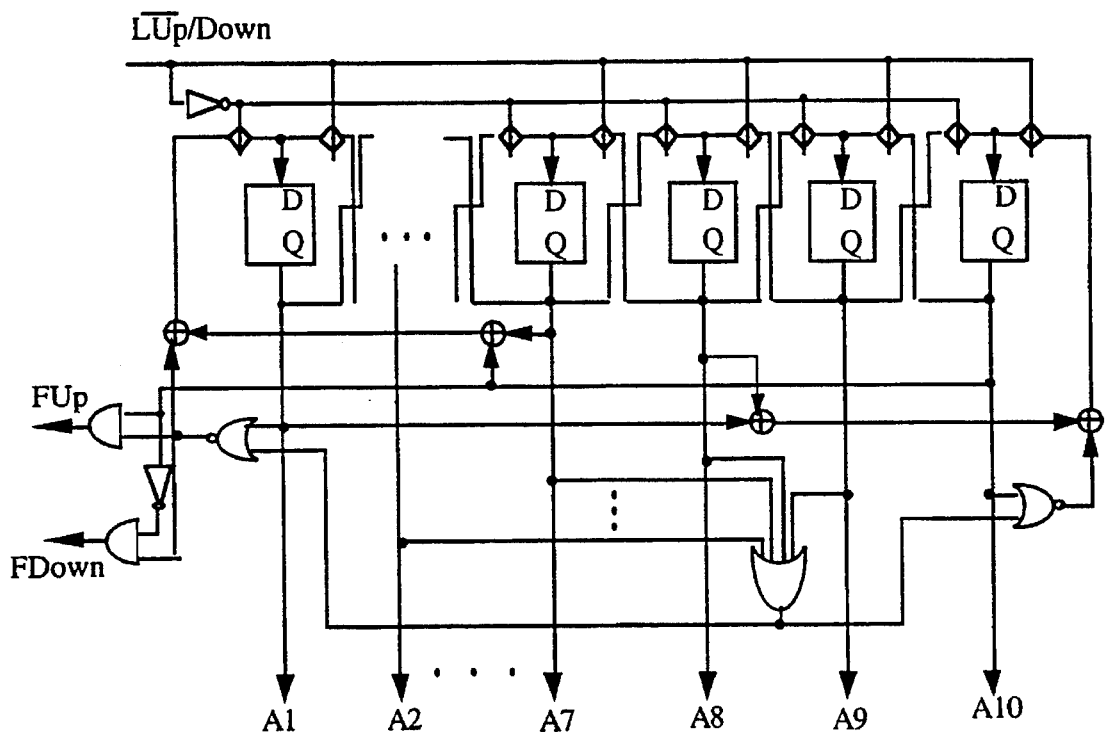
FIG. 4b is a block diagram illustrating an Up/Down LFSR with a NOR function in the feedback loop.

Finally in order to generate all the $2^n$ binary vectors one has to use an LFSR with primitive characteristic polynomial and to add in the feedback loop a NOR gate with n−1 inputs (see McCLUSKEY E. J., "Logic design principles". Prentice Hall, Englewood Cliffs, N.J. 07632, 1986). The Up/Down implementation corresponding to this circuit can be derived easily as exemplified in FIG. 4b (for external XOR LFSR). The LFSR is initialized to the all 0's state. In FIG. 4b we take advantage of the NOR function in order to generate the signals FUp and FDown (end of the Up and of the Down sequences), which are useful for the BIST implementation (see the equations of signals Lck and CSEQ presented later).

The design for the internal XOR implementation can be derived easily in a similar way and it is not detailed here.

3—When a cell is addressed we have to perform several read and write operations. An instance generator will be used to determine the instance during which we perform each of these operations:

We note that the sequences of the table III perform four operations in each RAM cell. Thus we need four basic instances to perform these operations plus one instance to change the state of the BIST circuitry (next address, next sequence etc). The required instances T1, T2, T3, T4, and T5 can be generated by a 5-stages shift register initialized to the instance T1 (state 10000). As we have seen the sequences S1°, S2°, S3° and S4° differ from S1, S2, S3 and S4 only on the fact that in the former ones there are not write operations. Thus if during the sequences S1°, S2°, S3° and S4° the instance generator blocks the instances corresponding to the write operations of the sequences S1, S2, S3 and S4, then we can implement both these sets of sequences by using a circuitry which generates the sequences S1, S2, S3 and S4.

Figure 5:
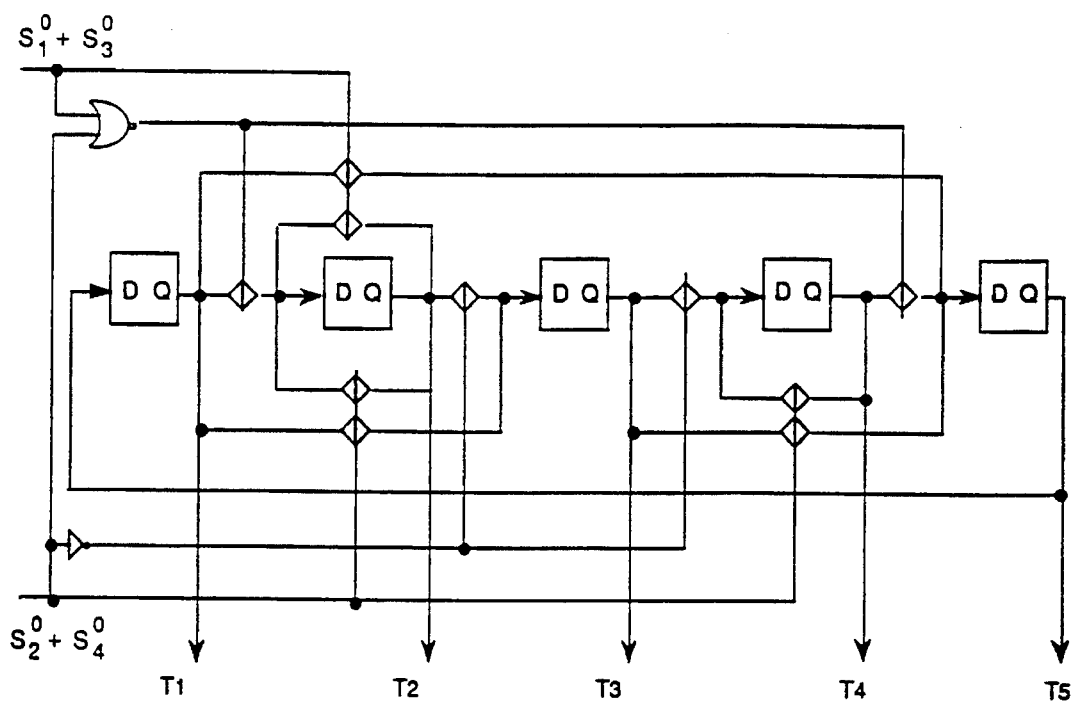
FIG. 5 is a block diagram illustrating the instance generator for transparent BIST.

An instance generator allowing to do that is implemented as in FIG. 5. The signal S1°+S3°=(S1'+S3')S° is used to avoid the activation of the instances T2, T3 and T4 during the sequences S1° and S3° and the signal S2°+S4°=(S2'+S4') S° is used to avoid the activation of the instances T2 and T4 during the sequences S2° and S4° (during these instances we perform the write operations in the sequences S1, S3 and S2, S4 respectively).

Figure 6:
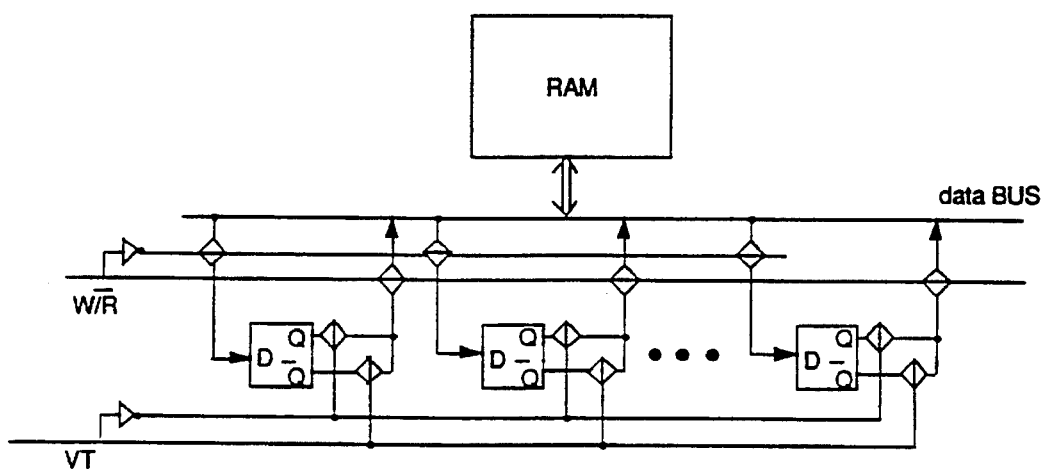
FIG. 6 is a block diagram illustrating the test data generation for transparent BIST.

4—A test data generator is required in order to generate the data to be written in the RAM. Since each data to be written in the RAM is equal to the last read data of the RAM or to its inverse, a register (called test data register) is used in order to store this data as shown in the FIG. 6. In this figure the signal W/$\overline{R}$ is used to store the read data to the register or to load the data BUS with the direct or the inverse contents of the register (i.e. the data to be written in the RAM). The signal VT selects the direct or the inverse contents of the register according to the requirements of the algorithm.

5—Finally a combinational block uses the signals generated by the other blocks and generates the signals which determine the type of operation (read or write), the data to be written etc. This is the operation control block. The generated signals are:

W/$\overline{R}$=(S1'+S3')(T2+T3+T4)+(S2'+S4') (T2+T4). This signal determines during the test phase the value of the read/write control input of the RAM. It is also used in FIG. 6. For reasons explained previously this signal takes tile same values during both the sequences of table II and of table III.

VT=(S1'+S2')T4+(S1'+S4').T2+S3' T3. This signal also takes the same values during both the sequences of table II and of table III.

LCk=T5+S2.Fup. This signal is the clock of the address generator.

CSEQ= T $\overline{[(\text{Up/Down}).\text{Fup}+(\text{Up/Down}.\text{Fdown})]}$. This signal is the clock of the sequence control block.

The equations for the above clock signals are valid for flip-flops which change state on the high level of the clock. For other flip-flops types these equations have to be modified.

R=(S2°+S3°)T1 +S4°T3). This signal will be used to invert the data read during the instance T1 of the sequences S2° and S3° and during the instance T3 of the sequence S4°, before to inject these data to the output compactor. This will allow to have the same expected signatures for the sequences of table II and III.

6—The output response verification will be performed by an output compaction block. This block can be an MISR (multiple input signature register) or any other compaction scheme. The signature computed during the sequences of table II will be compared against the signature computed during the sequences of table III. The comparison can be internal in the chip or external (the signatures will be shifted out). As said previously the signal R will enable the inversion of some data injected in the output compactor. The signature analyzer (or more generally the output data compactor) used in this scheme is a standard one and not need to be presented. As concerning the scheme based on the signature initialization algorithm (table IV), it uses an inovative data compactor described below:

In the case of this scheme we will use an Up/Down output data compactor in order to obtain a predictable signature. During the Down (resp. the Up) mode, we compact the data read in the algorithm of table IV, and during the Up (resp. the Down) mode, we compact the data read in the algorithm of table II (some of these data have to be inverted as explained above). Since the data sequences injected to the data compactor during these modes, are the same but have reverse ordering, the final signature is equal to the initial state of the data compactor, and thus, it is predictable. This behaviour is due to the fact that we define an Up/Down data compactor to have the following property: if the state transition function of the Up mode is (data input=$D_q$, present state=$S_q$)→ next state=$S_{q+1}$, then, in the Down mode, we will have (data input=$D_q$, present state=$S_{q+1}$)→next state=$S_q$. For instance, if we desire to use an Up/Down signature analyzer which, in the Up mode, behaves as an MISR, then, the Up/Down signature analyzer will be implemented by using an Up/Down LFSR as the ones described previously. In the Up mode, the signature analyzer works as a conventional MISR.

Figure 7:
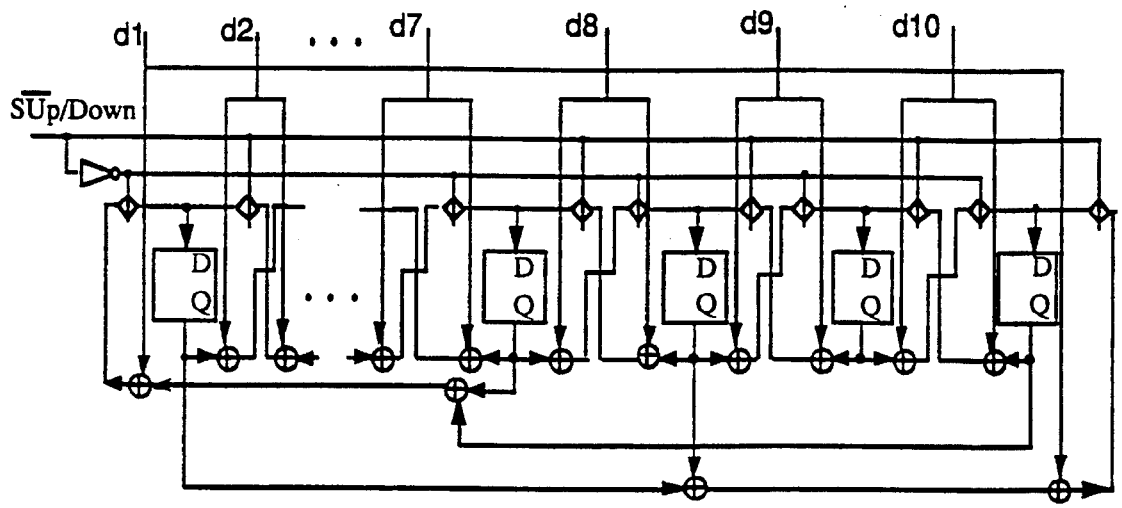
FIG. 7 is a block diagram illustrating an Up/Down signature analyzer based on external XOR Up/Down LFSR.

During the Down mode, the inputs of the cells are computed as follows:

If, during the Up mode, the input of the cell i is $d_{j\oplus}li$ (dj being the bit j of the input data, and li being the signal injected in the cell i of the Up/Down LFSR during its Up mode), then, during the Down mode of the signature analyzer, the input of the cell i−1 is $d_{j\oplus}li-1'$ (li−1' being the signal injected in the cell i−1 of the Up/Down LFSR during its Down mode). In the above, in the case i=1 (first cell of the LFSR), i−1 will be replaced by n (last cell of the LFSR). This construction is illustrated in FIG. 7 by using an external XOR LFSR. This construction is valid for both serial signature analyzers (in that case, we have only one input data), and parallel signature analyzers (MISR).

Note that the transparent test algorithm implemented in this section is derived from the Marinescu's one which requires two test data vectors, the all 0's one and the all 1's one. In that case, the transparent BIST implementation requires to use the signal VT. If VT=1, the test data are obtained by inversing all the bits of the test data register contents, while if VT=0, the test data are equal to the test data register contents (see FIG. 6). If the RAM test algorithm uses any other two test vectors, we need again a VT signal, but in that case the bit positions to be inverted are changed. For instance, if the standard test algorithm uses the test data 010101 . . . 01 and 101010 . . . 10, then VT=1 will invert the odd bit positions and VT=0 will invert the even bit positions. If the standard test algorithm uses three or four test vectors, then we must use two signals VT1 and VT2. For instance, if the test algorithm uses the test vectors 000000 . . . 00, 111111 . . . 11, 010101 . . . 01 and 101010 . . . 10, then VT1=1 will invert the odd bit positions and VT2=1 will invert the even bit positions, while VT1=0 and VT2=0 will not invert any bit position. Thus, for the test vector 000000. . . 00, we will use the values VT1=0 and VT2=0, for the test vector 111111 . . . 11, we will use the values VT1=1 and VT2=1, for the test vector 010101 . . . 01, we will use the values VT1=1 and VT2=0, and for the test vector 101010 . . . 10, we will use the values VT1=0 and VT2=1. More generally, if the test algorithm uses m test vectors with $2^{k-1}<m\leq 2^k$, then we will use k signals VT1, VT2, . . . , VTk. In the extreme case, we will need r VTi signals (r being the length of the RAM words). That is, we will use a VTi signal for each data bit position i.

A similar situation is valid for the signal R used for inverting some bits injected in the signature analyzer. For a number m (m>2) of test vectors, the R signal will be split into several Ri signals. For $2^{k-1}<m\leq 2^k$, we will use k Ri signals. In the extreme case, we will use a Ri signal for each data bit position i.

Scan path based transparent RAM testing

The transparent RAM testing can also be implemented using scan path techniques. Such an implementation is more adequate when we implement in some circuit the transparent testing of both RAM blocks and logic blocks, since the logic blocks transparent testing uses scan path techniques.

The scan path based transparent RAM testing is illustrated below.

For standard test algorithms, scan path can be used to bring the address vectors to the address input lines and/or to bring the test data to the data input lines and/or to collect the output responses.

For transparent test algorithms:

a) the addressing is the same as for standard algorithms. Therefore, no particular techniques are required to apply the address vectors.

b) the test data are determined by the contents of the test data register which stores the data of the last read operation. When a write is performed, some bits of the test data register have to be inverted. In the BIST implementation this was determined by the values of the VTi signals. In the extreme case, we assign a VTi signal to each bit position i of the test data register. The technique used for the scan path implementation is similar. A signal VTi is assigned to each bit position of the test data register. Then, the scan path will be used in order to bring the values of the VTi signal.

c) some data read during the signature prediction sequence must be inverted before being injected to the signature analyzer. In the BIST implementation the bit positions to be inverted was determined by the values of the Ri signals. The technique used for the scan path implementation is similar. A signal Ri is assigned to each bit position i of the RAM data outputs. The values Ri will be brought in by the scan path (the same as the one used to bring the values VTi). The Ri signals are used as follows: when a data is read from the RAM, it is stored into the test data register. Then, the contents of the test data register are loaded to the data BUS after some bits of these contents are inverted according to the values of the Ri signals. Then, the data BUS is connected to the signature analyzer or to the scan path which collects the output responses.

Figure 8:
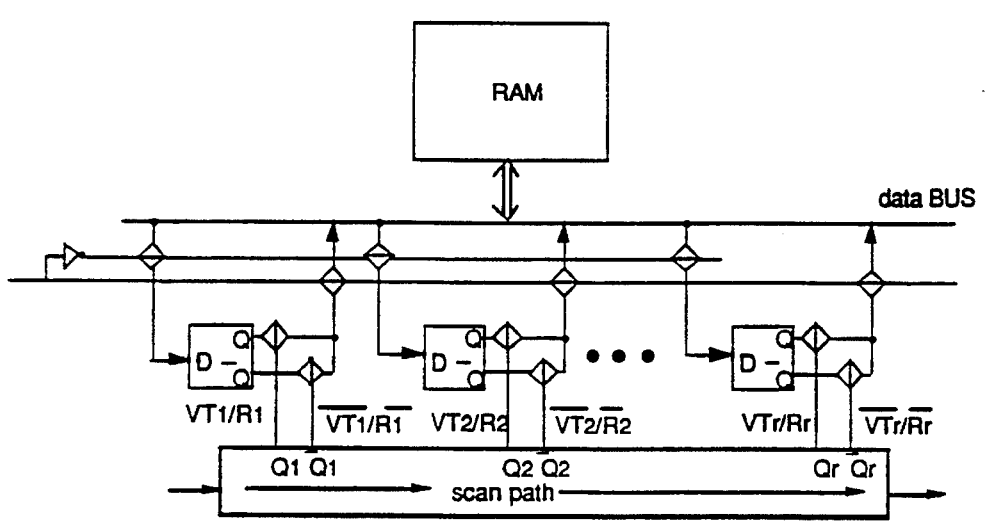
FIG. 8 is a block diagram illustrating the test data generation for scan path based transparent testing.

The mechanism presented in FIG. 8 allows to perform both operations described in b) and c). Note that, in order to perform efficiently these operations, we can modify the test data as shown later, For instance, instead of using the test vectors 000000 . . . 00 and 111111 . . . 11, one can use the test vectors 010101 . . . 01 and 101010 . . . 10. This corresponds to the vectors 010101 . . . 01 and 101010 . . . 10 for the signals VTi and Ri. These vectors can be obtained one from the other by means of only one shift.

Improved transparent BIST and scan path implementations

Figure 9:
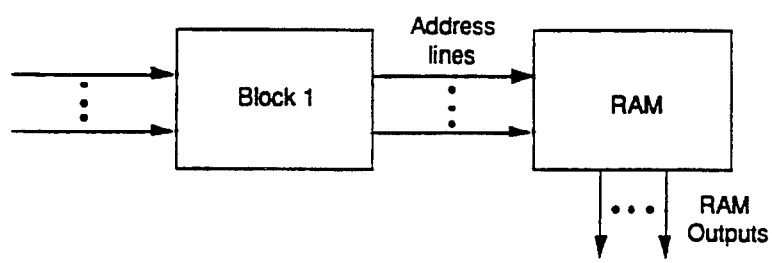
FIG. 9 is a block diagram illustrating an embedded RAM.

In the following we show that using as address generator an Up/Down LFSR instead of an Up/Down counter allows to improve the transparent BIST and scan path implementations for embedded RAMs. In many ASICs, RAMs are embedded blocks. For instance the addresses of the RAMs can be generated by another block as shown in FIG. 9. In a global BIST implementation of the integrated circuit, the block 1 has to be BISTed as well. For instance a test pattern generator and a signature analyzer can be used for this block.

The transparent RAM BIST implementations or any other RAM BIST implementations which use an Up/Down LFSR as address generator allows a very economic solution to this problem: the Up/Down LFSR can be reconfigurated easily to a MISR in order to perform signature analysis for the block 1. On the other hand the Up/Down counters used in other RAM BIST schemes have not this advantage.

Figure 10:
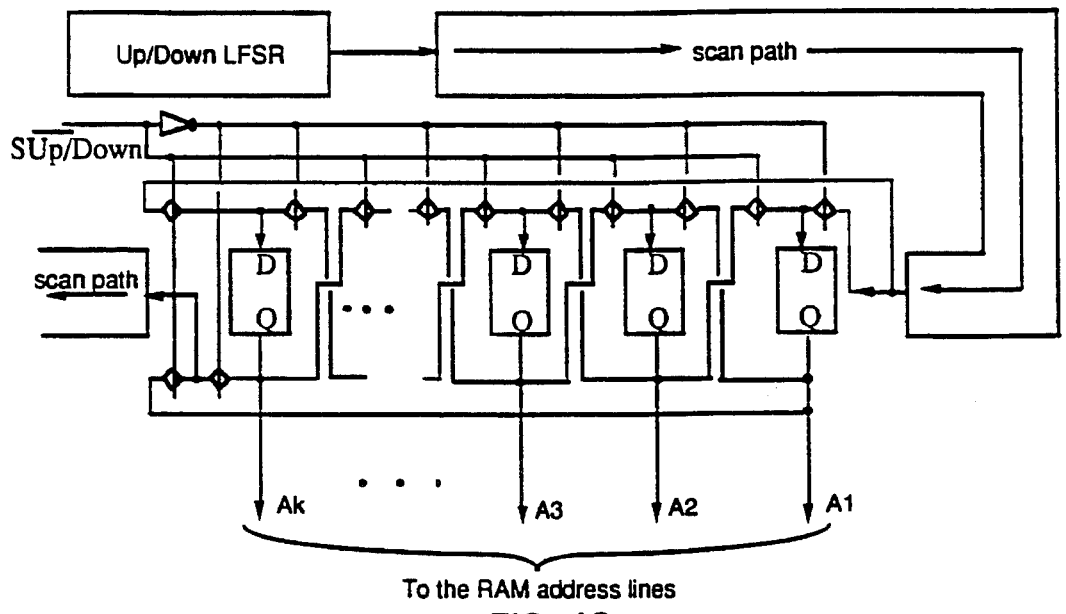
FIG. 10 is a block diagram illustrating a RAM addressing scheme using scan path.
Figure 11:
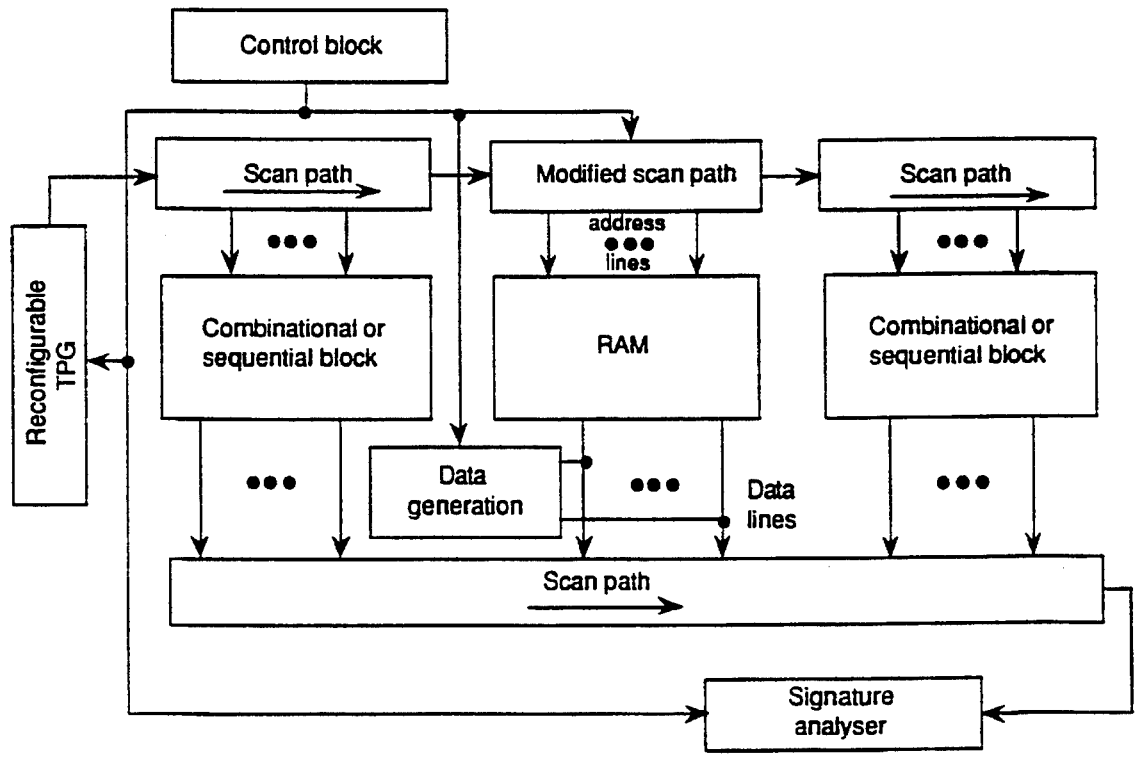
FIG. 11 is a block diagram illustrating a global BIST using scan path.

Another popular design for testability technique uses a scan path in order to allow access to the inputs and outputs of the embedded blocks. A draw back of this technique is that in generaly, if a block has k inputs, then, one needs k clock cycles (k shifts) in order to apply each test vector. Using an Up/Down LFSR for address generation allows to solve this problem. An efficient BIST implementation for ASICs uses scan path as shown in FIG. 11. In this figure, a single pseudorandom test pattern generator and a signature analyzer allows to test all the blocks via the scan path. In generally the pseudorandom test ensures a good fault coverage for the combinational blocks and so for the sequential ones which (via the scan path) are tested as combinational ones. On the other hand a deterministic BIST or transparent BIST for RAMs can be implemented efficiently and ensures much higher fault coverage than pseudorandom BIST. In such a scheme it is important to have an address generator compatible with the scan path in order to reduce the test time. We note that if we inject in the scan path input the output of a cell of a n-bit LFSR, we can verify that we need n shifts for the first vector and only one shift for each other vector. So if one uses an Up/Down LFSR, then, during the Up operation he just needs to inject the output of one cell (for instance the nth cell) to the scan path input. A particular implementation of the RAM scan path part allows to ensure this property for the whole (i.e. UP and Down) operation of the LFSR. The critical point is the transition from the Up to the Down function and vice versa. We examplify the implementation for the external XOR LFSRs:

The scan path part corresponding to the RAM address inputs is implemented to perform both shift left and shift right operations, as shown in FIG. 10.

During the Up function of the LFSR we inject to the scan path the input of the cell 1 of the LFSR, while during the LFSR Down function we inject the input of cell n of the LFSR.

These simple modifications allow us to apply (during the Down operation) the inverse sequence to the RAM address inputs by using one shift per address vector. This fact can be verified easily and is not detailed here. Note that when one moves from an Up addressing sequence to a Down one (e.g. when one passes from the sequence S2 to the sequence S3 in the algorithm of table I), then, the Down function of the RAM address inputs scan path part must be activated (i.e. S $\overline{\text{Up/Down}}$=1) when all the Up addresses have fed the RAM address inputs. That is to say S$\overline{\text{Up/Down}}$=becomes 1 with a delay of m clock cycles after the activation of the Down function (i.e. L$\overline{\text{Up/Down}}$=1) of the Up/Down LFSR (where m is the scan path length between the Up/Down LFSR and the RAM address inputs scan path part). A similar technique will be used when one moves from a Down addressing sequence to an Up one.

The above scheme can be applied to any RAM block of the system.

A single control block can be used for all the BISTed RAMs since this block is independent of the size of the RAM. Only one LFSR will be used for both: test pattern generation for combinational (or sequential) blocks and RAM address generation. During the test of a RAM block the test pattern generator will be reconfigurated to give an Up/Down LFSR with the appropriate length. The scan path part corresponding to the RAM address inputs will also be reconfigurated as shown in FIG. 10. The data generator is a very compact block (see FIG. 4b), so that it can be implemented locally to each RAM block without significant area overhead. The global BIST scheme is given in FIG. 11.

If the output response verification is performed by a comparator local to the RAM outputs, the output data of the RAM do not need to be injected to the scan path used in FIG. 11.

Note finally that for a scan implementation where the test pattern generator is not implemented in the chip one can simulate the BIST implementation proposed here. Due to the properties presented above the resulting test address sequences can be scanned in the circuit by means of a test vector per clock cycle. Of course the scan path part corresponding to the address inputs of the RAM must be implemented to allow shift left and shift right (as in FIG. 10). These advantages are lost if one uses an address ordering based on binary counting.

Concerning the test data we note that the data generator is a compact block, so that it can be implemented locally to each RAM block without significant area overhead. If in the case of a standard (i.e. non transparent) test algorithm one decides to apply the test data via a scan path, then if he uses as test data the vectors 00000 . . . 00 and the 11111 . . . 11 (as in the case of the Marinescu's algorithm applied to RAMs having a column multiplexing of 1-out-of-4 or of greater order), then, he needs n shifts to apply each of these vectors. This problem can be avoided by using the vectors 01010 . . . 01 and 10101 . . . 10, since the one is obtained from the other by means of one shift. From corollary 1 the resulting algorithm has the same fault coverage as the original one. This is because the new test vectors comes from the original ones by inversing the values of the second, fourth, sixth, etc bits. This can be extended in the case the algorithm uses several couples of data. For instance if the algorithm uses the data couples (000000 . . . 000, 111111 . . . 11), and (101010 . . . 10, 010101 . . . 01), (as in the case of the Marinescu's algorithm applied on RAMs having a 1-out-of-2 multiplexing), then, these couples can be replaced by the couples (001100 . . . 11, 110011 . . . 00), and (100110 . . . 01, 011001 . . . 10). In that case we need two shift operations to transform the one vector of a couple to the second one. Similarly if the initial couples are (000000 . . . 000, 111111 . . . 111), (001001 . . . 001, 110110 . . . 110), (010010 . . . 010, 101101 . . . 101), and (011011 . . . 011, 100100 . . . 100), the new couples will be (000111 . . . 000, 111000 . . . 111), (001110 . . . 001, 110001 . . . 110), (010101 . . . 010, 101010 . . . 101), and (011110 . . . 011, 110011 . . . 110) (in that case we need three shift operations to transform the one vector of a couple to the second one), and so on. Thus we reduce the number of shifts per data vector, which will be equal to the length of the RAM words, if these transformations are not used. If the fault model verifies the symmetric property, then, the corollary 1 guaranties that these transformations do not not decrease the fault coverage. These transformations are also useful for transparent testing implemented by using scan path. In that case we will reduce the shifts required to bring the values VTi and Ri in the scheme of FIG. 8, since the values of these signals correspond to the values of the test vectors of the standard test algorithm.

Transparent BIST for self-checking RAMs

Some RAMs use self-checking mechanisms for on-line concurrent error detection. For instance the RAM contents can be protected by using parity codes, and the read data of the RAM are verified by some parity checker(s). In that case the parity checker(s) can also be used to perform the output response verification. Then the transparent BIST will consist on performing the basic transparent test algorithm. During this algorithm, the code checkers allow to verify the read data. The signature prediction sequence is avoided and so the output compactor.

Note that the operations performed during the basic transparent test algorithm may alter the code (e.g. inversing a word which has an even number of bits transforms an even parity to an odd one and an odd parity to an even one). In order to avoid the error indication inconsistency, the BIST circuitry will generate a code word/noncode word indication signal according to (NICOLAIDIS, M. "Self-exercising checkers for unified built-in self-test (UBIST)". IEEE Transactions on Computer-Aided Design, vol. 8, n° 3, pp 1203–218, March 1989).

Transparent BIST based on test segmentation

Another way to implement the transparent BIST consists on testing a segment of the RAM each time. The segment will consist on k rows of the RAM. A small auxiliary RAM of size equal to this segment will be implemented within the BIST circuitry Before testing each RAM segment the segment contents are stored in the auxiliary RAM. Then the segment is tested using a basic transparent test algorithm. During this algorithm each read data is compared against the respective data of the auxiliary RAM. In some instances one of the compared data has to be inverted in order the comparison to match (similarly to the inversion of some data during the signature prediction sequence). After the end of the segment testing, the contents of another segment are loaded in the auxiliary RAM and the new segment is tested, and so on . .

This technique avoids the use of a signature prediction sequence and of an output compactor. In return the test segmentation can reduce the fault coverage, and we must use an auxiliary RAM and a comparator. Furthermore the sequencing becomes more complex and so the BIST circuitry.

The fault coverage can be decreased because we can not test the interactions between cells which do not belong to the same segment. However if the distance between two rows is greater than an integer d then one can consider that there are not interaction between the cells of these rows. In that case we can partition the RAM in such a way that any set of rows having mutual distance lower than or equal to d belongs to at least one segment. For instance for d=2 we can use segments having at least 3 rows. Let us consider that we use segments having 4 rows, then, the first segment will consist on the rows 1, 2, 3 and 4, the second segment will consist on the rows 3, 4, 5 and 6, the third segment will consist on the rows 5, 6, 7 and 8, and so on. We remark that there is an overlapping between the segments, that is some cells of the second segment also belong to first segment and some other cells of this segment belong to the third segment. This is necessary in order to test the interactions between the boundary cells of the segments. We note that each segment must include d+1 rows or more. The choice will be based on the following criterion: increasing the segment size decreases the test length but increases the hardware overhead (size of the auxiliary RAM).

Ultimately we can have d=1 and we can use segments of two rows, the minimum size required for the auxiliary RAM will be equal to the size of two rows of the RAM.

An alternative implementation of the above technique is as following.

For each RAM segment:

load the segment contents to the auxiliary RAM, test the RAM segment by a standard (i.e. nontransparent) test algorithm, restore the segment contents by using the contents of the auxiliary RAM, and go to the next segment.

We remark that in this last technique we use a standard test algorithm in order to test each segment, but at the end of the segment test session we must restore the segment contents.

I claim:

1. A method for testing a memory coupled to a data compactor, comprising the following steps:

a) providing a transparent test sequence including a succession of read and write operations on each memory cell, such that the initial state of the memory cell is re-established at the end of the test sequence and wherein the results of a predetermined number of read operations are to be provided to the data compactor;

b) supplying the data compactor with data or the complements thereof, that the test sequence would provide if the memory cell were faultless;

c) storing the state of the data compactor corresponding to the supplied data;

d) carrying out the test sequence to change the state of the data compactor if faults are detected in the memory; and e) comparing the state of the data compactor after carrying out the test sequence with the stored state.

2. The method as claimed in claim 1, wherein step b) comprising the following steps:

executing only said predetermined number of read operations of the test sequence; and providing the data compactor with the result of each read operation, or the complement thereof whenever a write operation preceding the read operation in the complete test sequence would invert the state of the cell if the complete test sequence were achieved.

3. The method as claimed in claim 1, wherein step b) is exchanged with step d).

4. The method as claimed in claim 1, comprising the following initial steps:

providing an un-transparent test sequence including groups of consecutive read, write-1, and write-0 operations on each cell;

replacing each write-1 or write-0 operation by a write operation of the first value read in the cell; and replacing each write-0 or write-1 operation by a write operation of the complement of the first value read in the cell.

5. The method as claimed in claim 4, comprising, if the last write operation of the sequence inverts the initial state of the cell, the step of inserting at the end of the sequence a read operation followed by a write operation of the complement of the read value.

6. A method for testing a memory coupled to a data compactor having first and second analysis modes such that, when the data compactor is provided in the first mode with a succession of values in a direct order and then, in the second mode, the data compactor is provided with the same succession of values in the reverse order, the initial state of the data compactor is re-established, which method comprises the following steps:

a) providing a transparent test sequence including a succession of read and write operations on each memory cell, such that the initial state of the memory cell is re-established at the end of the test sequence and wherein the results of a predetermined number of read operations are to be provided to the data compactor;

b) providing the data compactor with data, or the complements thereof, that the test sequence, executed in reverse order, would provide if the memory cell were faultless;

c) toggling the data compactor between the first and second analysis modes;

d) carrying out the test sequence to change the state of the data compactor if faults are detected in the memory; and e) comparing the state of the data compactor after carrying out the test sequence with its initial state.

7. The method as claimed in claim 6, wherein step b) comprises the following steps:

executing only said predetermined number of read operations of the test sequence, in reverse order; and providing the data compactor with the result of each executed read operation, or the complement thereof whenever a write operation preceding the read operation in the complete test sequence would invert the state of the cell if the complete test sequence were achieved.

8. The method as claimed in claim 6, wherein the data compactor comprises an up/down Linear Feedback Shift Register (LFSR) having circularly coupled flip-flops, and the method comprises the following steps:

in the first analysis mode, switching the LFSR in up mode and combining the state of at least one cell to be tested to the input of a corresponding flip-flop; and in the second analysis mode, switching the LFSR in down mode and combining the state of said at least one cell to the input of the flip-flop circularly preceding said corresponding flip-flop.

9. The method as claimed in claim 6, wherein step b) is exchanged with step d).

10. The method as claimed in claim 6, comprising the following initial steps:

providing an un-transparent test sequence including groups of consecutive read, write-1, and write-0 operations on each cell;

if a group of consecutive operations starts with a write operation, inserting a read operation before this write operation;

replacing each write-1 or write-0 operation by a write operation of the first value read in the cell; and replacing each write-0 or write-1 operation by a write operation of the complement of the first value read in the cell.

11. The method as claimed in claim 10, comprising, if the last write operation of the sequence inverts the initial state of the cell, the step of inserting at the end of the sequence a read operation followed by a write operation of the complement of the read value.

* * * * *